United States Patent
Kulkarni et al.

(10) Patent No.: US 11,544,547 B2
(45) Date of Patent: Jan. 3, 2023

(54) ACCELERATING BINARY NEURAL NETWORKS WITHIN LATCH STRUCTURE OF NON-VOLATILE MEMORY DEVICES

(71) Applicant: Western Digital Technologies, Inc., San Jose, CA (US)

(72) Inventors: Anand Kulkarni, San Jose, CA (US); Won Ho Choi, Santa Clara, CA (US); Martin Lueker-Boden, Fremont, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 450 days.

(21) Appl. No.: 16/908,576

(22) Filed: Jun. 22, 2020

(65) Prior Publication Data
US 2021/0397930 A1 Dec. 23, 2021

(51) Int. Cl.
 *G06N 3/063* (2006.01)
 *G11C 11/409* (2006.01)
 (Continued)

(52) U.S. Cl.
 CPC .............. *G06N 3/063* (2013.01); *G06F 7/50* (2013.01); *G06F 7/523* (2013.01); *G06F 7/5443* (2013.01); *G06K 9/6227* (2013.01); *G11C 11/409* (2013.01)

(58) Field of Classification Search
 CPC ........ G06N 3/063; G06N 3/0454; G06N 3/08; G06F 7/50; G06F 7/523; G06F 7/5443;
 (Continued)

(56) References Cited

U.S. PATENT DOCUMENTS 7,324,366 B2 1/2008 Bednorz et al.
7,505,347 B2 3/2009 Rinerson et al.
(Continued)

FOREIGN PATENT DOCUMENTS

CN 110597555 A 12/2019
CN 110598858 A 12/2019

OTHER PUBLICATIONS

Resch, Salonik, et al., "PIMBALL: Binary Neural Networks in Spintronic Memory," ACM Trans. Arch. Code Optim., vol. 37, No. 4, Article 111, Aug. 2018, 25 pages.
(Continued)

*Primary Examiner* — Ajay Ojha
(74) *Attorney, Agent, or Firm* — Vierra Magen Marcus LLP

(57) ABSTRACT

A non-volatile memory device includes an array of non-volatile memory cells that are configured to store weights of a neural network. Associated with the array is a data latch structure that includes a page buffer, which can store weights for a layer of the neural network that is read out of the array, and a transfer buffer, that can store inputs for the neural network. The memory device can perform multiply and accumulate operations between inputs and weight of the neural network within the latch structure, avoiding the need to transfer data out of the array and associated latch structure for portions of an inference operation. By using binary weights and inputs, multiplication can be performed by bit-wise XNOR operations. The results can then be summed and activation applied, all within the latch structure.

20 Claims, 16 Drawing Sheets

(51) Int. Cl.
  *G06F 7/523* (2006.01)
  *G06F 7/50* (2006.01)
  *G06F 7/544* (2006.01)
  *G06K 9/62* (2022.01)

(58) Field of Classification Search
  CPC .......... G06F 2207/4824; G06K 9/6227; G11C 11/409; G11C 16/0483; G11C 7/1006; G11C 11/54; G11C 16/26
  See application file for complete search history.

(56) References Cited

U.S. PATENT DOCUMENTS

| | | | |
|---|---|---|---|
| 8,416,624 | B2 | 4/2013 | Lei et al. |
| 8,634,247 | B1 | 1/2014 | Sprouse et al. |
| 8,634,248 | B1 | 1/2014 | Sprouse et al. |
| 8,773,909 | B2 | 7/2014 | Li et al. |
| 8,780,632 | B2 | 7/2014 | Sprouse et al. |
| 8,780,633 | B2 | 7/2014 | Sprouse et al. |
| 8,780,634 | B2 | 7/2014 | Sprouse et al. |
| 8,780,635 | B2 | 7/2014 | Li et al. |
| 8,792,279 | B2 | 7/2014 | Li et al. |
| 8,811,085 | B2 | 8/2014 | Sprouse et al. |
| 8,817,541 | B2 | 8/2014 | Li et al. |
| 9,098,403 | B2 | 8/2015 | Sprouse et al. |
| 9,104,551 | B2 | 8/2015 | Sprouse et al. |
| 9,116,796 | B2 | 8/2015 | Sprouse et al. |
| 9,384,126 | B1 | 7/2016 | Sprouse et al. |
| 9,730,735 | B2 | 8/2017 | Mishra et al. |
| 9,887,240 | B2 | 2/2018 | Shimabukuro et al. |
| 10,127,150 | B2 | 11/2018 | Sprouse et al. |
| 10,459,724 | B2 | 10/2019 | Yu et al. |
| 10,528,643 | B1 | 1/2020 | Choi et al. |
| 10,535,391 | B2 | 1/2020 | Osada et al. |
| 10,643,119 | B2 | 5/2020 | Chiu et al. |
| 10,643,705 | B2 | 5/2020 | Choi et al. |
| 2014/0133228 | A1 | 5/2014 | Sprouse et al. |
| 2014/0133233 | A1 | 5/2014 | Li et al. |
| 2014/0133237 | A1 | 5/2014 | Sprouse et al. |
| 2014/0136756 | A1 | 5/2014 | Sprouse et al. |
| 2014/0136757 | A1 | 5/2014 | Sprouse et al. |
| 2014/0136758 | A1 | 5/2014 | Sprouse et al. |
| 2014/0136760 | A1 | 5/2014 | Sprouse et al. |
| 2014/0136762 | A1 | 5/2014 | Li et al. |
| 2014/0136763 | A1 | 5/2014 | Li et al. |
| 2014/0136764 | A1 | 5/2014 | Li et al. |
| 2014/0156576 | A1 | 6/2014 | Nugent |
| 2014/0136761 | A1 | 7/2014 | Li et al. |
| 2014/0294272 | A1 | 10/2014 | Madhabushi et al. |
| 2015/0324691 | A1 | 11/2015 | Dropps et al. |
| 2016/0026912 | A1 | 1/2016 | Falcon et al. |
| 2017/0098156 | A1 | 4/2017 | Nino et al. |
| 2017/0228637 | A1 | 8/2017 | Santoro et al. |
| 2018/0039886 | A1 | 2/2018 | Umuroglu et al. |
| 2018/0075339 | A1 | 3/2018 | Ma et al. |
| 2018/0144240 | A1 | 5/2018 | Garbin et al. |
| 2019/0251425 | A1 | 8/2019 | Jaffari et al. |
| 2020/0034697 | A1 | 1/2020 | Choi et al. |
| 2021/0224038 | A1* | 7/2021 | Song ................ G11C 7/1006 |
| 2021/0271959 | A1* | 9/2021 | Chettuvetty ............. G06N 3/04 |

OTHER PUBLICATIONS

Zamboni, Prof. Maurizio, et al., "In-Memory Binary Neural Networks," Master's Thesis, Master's Degree in Electronic Engineering, Politechnico Di Torino, Apr. 10, 2019, 327 pages.
Natsui, Masanori, et al., "Design of an energy-efficient XNOR gate based on MTJ-based nonvolatile logic-in-memory architecture for binary neural network hardware," Japanese Journal of Applied Physics 58, Feb. 2019, 8 pages.
Rastegari, Mohammad et al., "XNOR-Net: ImageNet Classification Using Binary Convolutional Neural Networks," proceedings ECCV 2016, Aug. 2016, 55 pages.
Wan, Diwen, et al., "TBN: Convolutional Neural Network with Ternary Inputs and Binary Weights," ECCV 2018, Oct. 2018, 18 pages.
Chen, Yu-Hsin, et al., "Eyeriss: An Energy-Efficient Reconfigurable Accelerator for Deep Convolutional Neural Networks," IEEE Journal of Solid-State Circuits, Feb. 2016, 12 pages.
Sun, Xiaoyu, et al., "Fully Parallel RRAM Synaptic Array for Implementing Binary Neural Network with (+1, -1) Weights and (+1, 0) Neurons," 23rd Asia and South Pacific Design Automation Conference, Jan. 2018, 6 pages. Gonugondla, Sujan K., et al., "Energy-Efficient Deep In-memory Architecture for NAND Flash Memories," IEEE International Symposium on Circuits and Systems (ISCAS), May 2018, 5 pages.
Gonugondla, Sujan K., et al., "Energy-Efficient Deep In-memory Architecture for NAND Flash Memories," IEEE International Symposium on Circuits and Systems (ISCAS), May 2018, 5 pages.
Nakahara, Hiroki, et al., "A Memory-Based Realization of a Binarized Deep Convolutional Neural Network," International Conference on Field-Programmable Technology (FPT), Dec. 2016, 4 pages.
Takeuchi, Ken, "Data-Aware NAND Flash Memory for Intelligent Computing with Deep Neural Network," IEEE International Electron Devices Meeting (IEDM), Dec. 2017, 4 pages.
Mochida, Reiji, et al., "A 4M Synapses integrated Analog ReRAM based 66.5 TOPS/W Neural-Network Processor with Cell Current Controlled Writing and Flexible Network Architecture," Symposium on VLSI Technology Digest of Technical Papers, Jun. 2018, 2 pages.
Chiu, Pi-Feng, et al., "A Differential 2R Crosspoint RRAM Array With Zero Standby Current," IEEE Transactions on Circuits and Systems—II: Express Briefs, vol. 62, No. 5, May 2015, 5 pages.
Chen, Wei-Hao, et al., "A 65nm 1Mb Nonvolatile Computing-in-Memory ReRAM Macro with Sub-16ns Mulitply-and-Accumulate for Binary DNN AI Edge Processors," IEEE International Solid-State Circuits Conference, Feb. 2018, 3 pages.
Liu, Rui, et al., "Parallelizing SRAM Arrays with Customized Bit-Cell for Binary Neural Networks," DAC '18, Jun. 2018, 6 pages.
Courbariaux, Matthieu, et al., "Binarized Neural Networks: Training Neural Networks with Weights and Activations Constrained to +1 or -1," arXiv.org, Mar. 2016, 11 pages.
U.S. Appl. No. 62/702,713, filed Jul. 24, 2018.
U.S. Appl. No. 16/368,441, filed Mar. 28, 2019.
U.S. Appl. No. 16/653,346, filed Oct. 15, 2019.
U.S. Appl. No. 16/653,365, filed Oct. 15, 2019.
Simon, Noah, et al., "A Sparse-Group Lasso," Journal of Computational and Graphical Statistics, vol. 22, No. 2, pp. 231-245, downloaded by Moskow State Univ. Bibliote on Jan. 28, 2014.
CS231n Convolutional Neural Networks for Visual Recognition, [cs231.github.io/neural-networks-2/#reg], downloaded on Oct. 15, 2019, pp. 1-15.
Krizhevsky, Alex, et al., "ImageNet Classification with Deep Convolutional Neural Networks," [http://code.google.com/p/cuda-convnet/], downloaded on Oct. 15, 2019, 9 pages.
Shafiee, Ali, et al., "ISAAC: A Convolutional Neural Network Accelerator with In-Situ Analog Arithmetic in Crossbars," ACM/IEEE 43rd Annual International Symposium on Computer Architecture (ISCA), Oct. 5, 2016, 13 pages.
Han, Song, et al., "Learning both Weights and Connections for Efficient Neural Networks," Conference paper, NIPS, Oct. 2015, 9 pages.
Jia, Yangqing, "Learning Semantic Image Representations at a Large Scale," Electrical Engineering and CS, University of Berkeley, Technical Report No. UCB/EECS-2014-93, May 16, 2014, 104 pages.
Wen, Wei, et al., "Learning Structured Sparsity in Deep Neural Networks," 30th Conference on Neural Information Processing Systems (NIPS 2016), Nov. 2016, 9 pages.
Wang, Peiqi, et al., "SNrram: An Efficient Sparse Neural Network Computation Architecture Based on Resistive Random-Access Memory," DAC '18, Jun. 24-29, 2018, 6 pages.

(56) References Cited

OTHER PUBLICATIONS

Zheng, Shixuan, et al., "An Efficient Kernel Transformation Architecture for Binary-and Ternary-Weight Neural Network Inference," DAC' 18, Jun. 24-29, 2018, 6 pages.

* cited by examiner

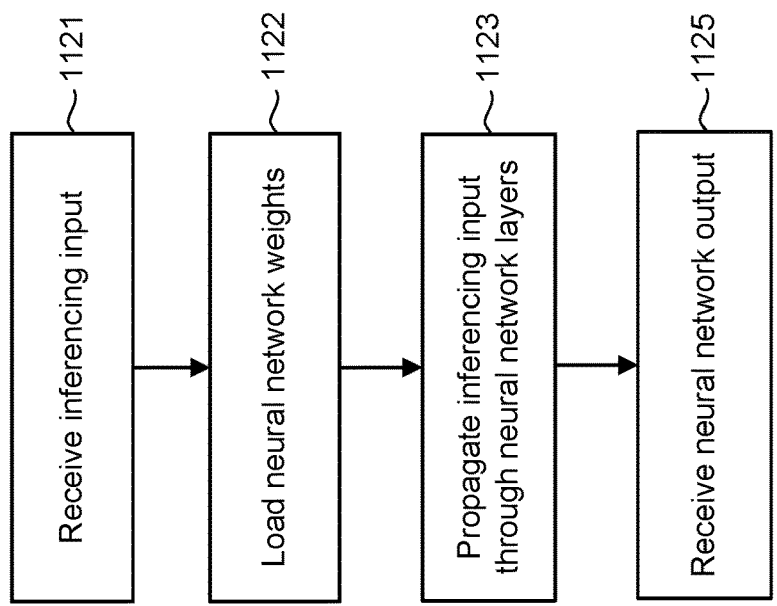
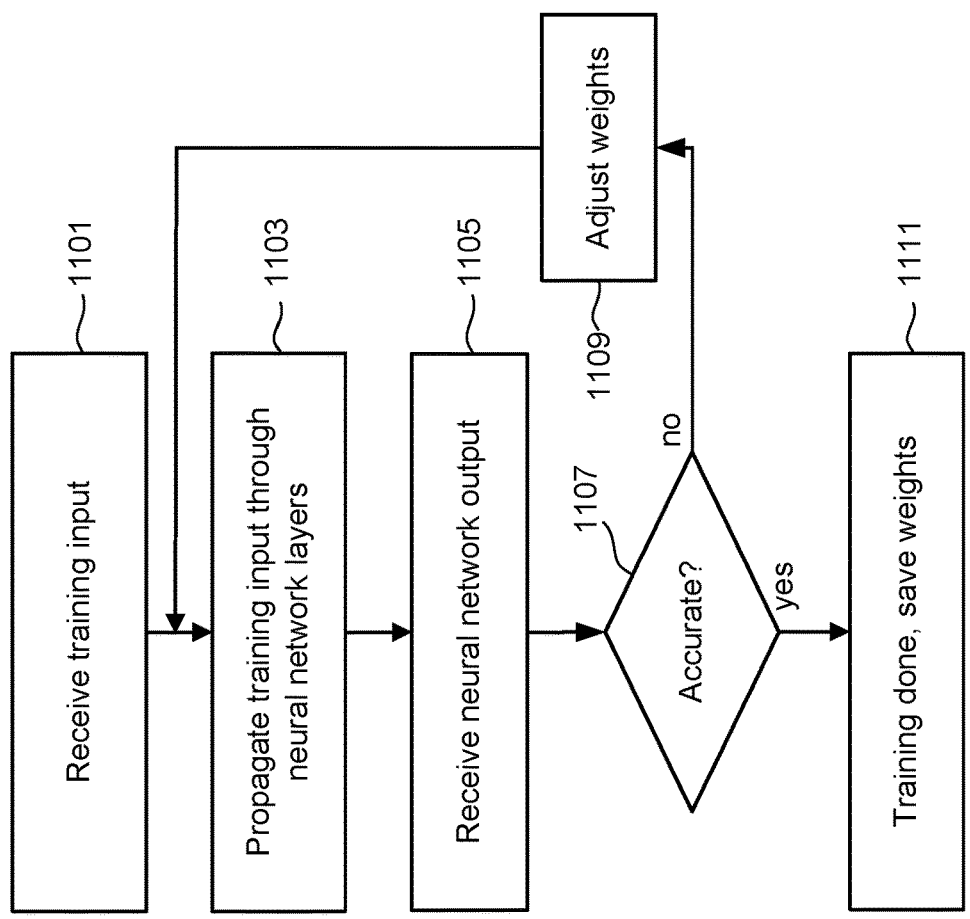

| Input (IN) | Weight (W) | Output (IN x W) |
|---|---|---|
| -1 | -1 | +1 |
| -1 | +1 | -1 |
| +1 | -1 | -1 |
| +1 | +1 | +1 |

Figure 14

| Input (IN) | Weight (W) | Output (IN x W) |
|---|---|---|
| 0 | 0 | 1 |
| 0 | 1 | 0 |
| 1 | 0 | 0 |
| 1 | 1 | 1 |

Figure 15

ACCELERATING BINARY NEURAL NETWORKS WITHIN LATCH STRUCTURE OF NON-VOLATILE MEMORY DEVICES

BACKGROUND

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a set of inputs. Although such neural networks can provide highly accurate results, they are extremely computationally intensive, and the data transfers involved in reading the weights connecting the different layers out of memory and transferring them into the processing units of a processing unit can be quite intensive.

BRIEF DESCRIPTION OF THE DRAWING

Like-numbered elements refer to common components in the different figures.

FIG. 11A is a flowchart describing one embodiment of a process for training a neural network to generate a set of weights.

FIG. 11B is a flowchart describing one embodiment of a process for inference using a neural network.

FIGS. 14 and 15 illustrate examples of the use of binary values in a neural network.

DETAILED DESCRIPTION

To reduce the amount of data transfer needed to perform inferencing operations for a neural network, techniques and memory structures are presented that allow for inferencing operations to be performed within a memory array of non-volatile memory cells and its associated data buffers of the latch structure used for read and write operations. Weights for the neural network can be stored in pages of data stored on the memory array. To perform a multiplication between the weights and an input of a layer of the neural network, a page of data holding the weight is read out of the array and stored in a page buffer for the memory array and the input is stored into a second buffer of the array. The input can be received over the input/output interface for the latch structure or be the output of an earlier neural network operation executed within the buffers of the latch structure. To generate the output of a layer, a multiply and accumulation operation for the layer can be performed within latch structure, avoiding the need to transfer out the weights of the neural network over the input/output interface of the read/write circuitry of the memory circuit. This allows the computations to be performed more rapidly and with lower power consumption.

To reduce the computational complexity and relax the memory requirements of neural networks, the main embodiments described below use Binary Neural Networks (BNNs). In BNNs, the weights and inputs of the neural network are truncated into binary values and the binary arithmetic simplifies multiplication and addition to XNOR (exclusive not OR) and bit-count operations, which can be followed by an activation operation, all within the buffers of the latch structure.

Figure 1:
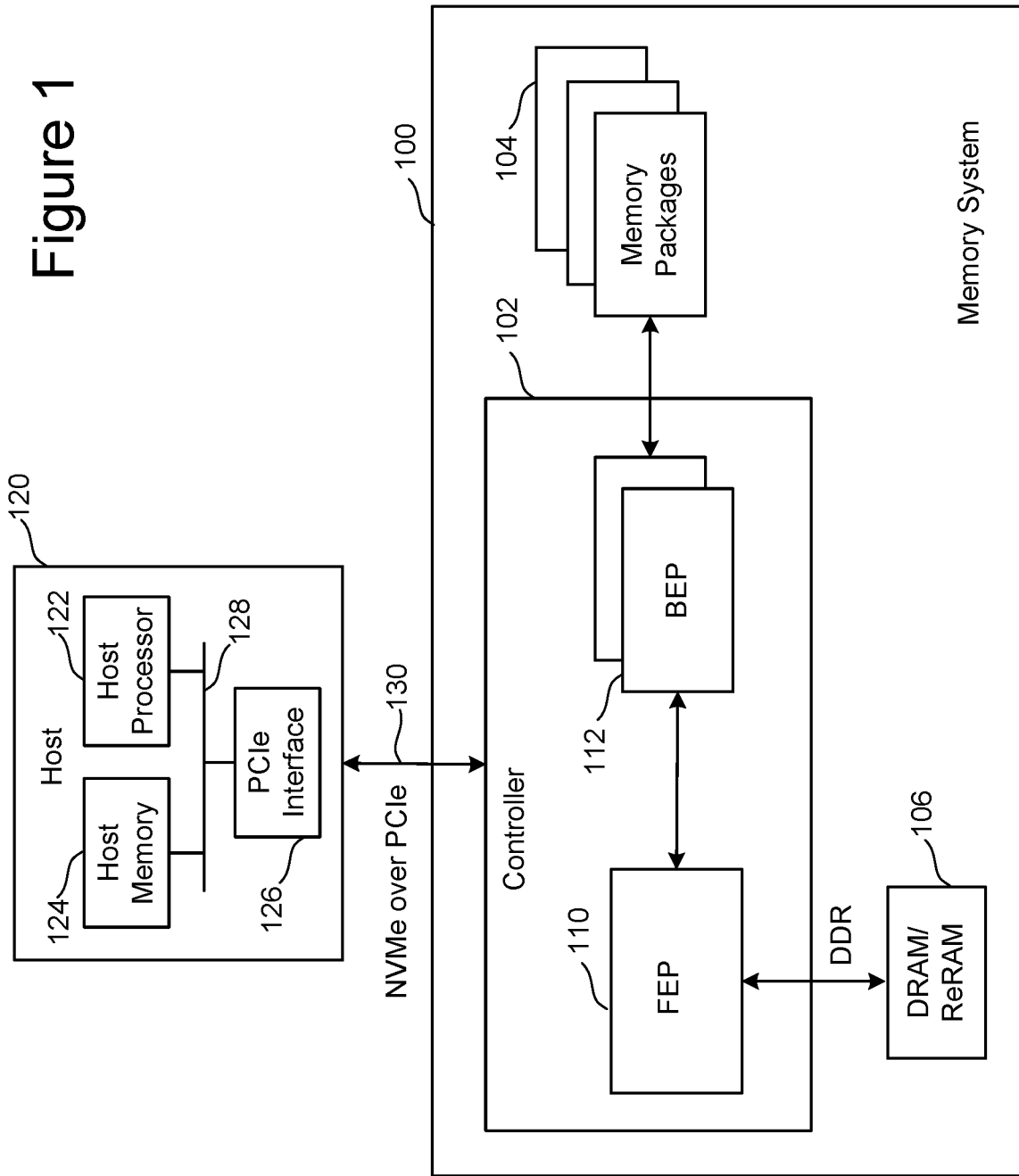
FIG. 1 is a block diagram of one embodiment of a memory system connected to a host.

FIG. 1 is a block diagram of one embodiment of a memory system 100 connected to a host 120. Memory system 100 can implement the technology proposed herein, where the neural network inputs or other data are received from the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). Multiple BEPs, such as BEP circuit 112, can be separate SoCs or within the same SoC as the FEP circuit 110. FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two-dimensional NAND flash memory and/or three-dimensional NAND flash memory). In other embodiments, the memory package can include other types of memory.

Controller 102 communicates with host 120 via an interface 130 that implements, for example, a standard interface such as NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120. In other embodiments, the controller 102 may communicate with host 102 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to an PCIe example.

Figure 2:
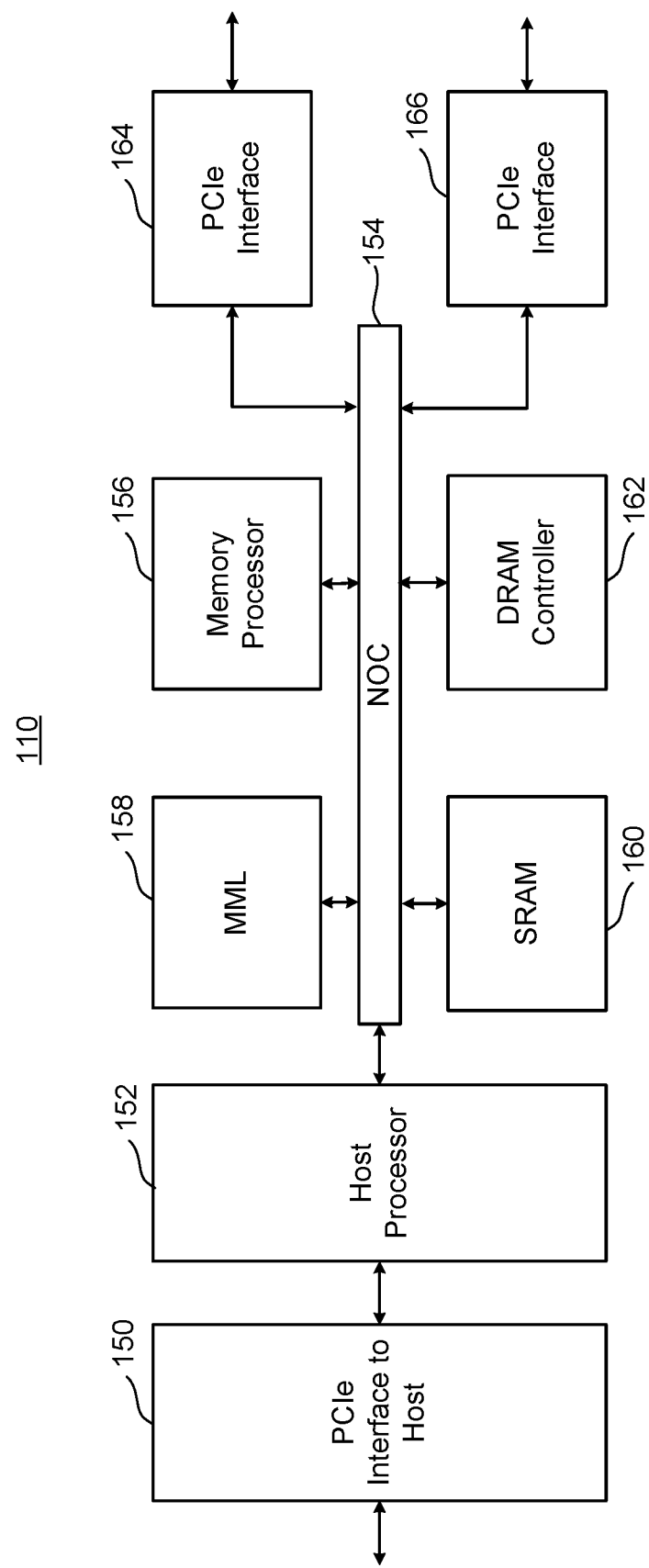
FIG. 2 is a block diagram of one embodiment of a Front End Processor Circuit. In some embodiments, the Front End Processor Circuit is part of a controller.

FIG. 2 is a block diagram of one embodiment of FEP circuit 110. FIG. 2 shows a PCIe interface 150 to communicate with host 120 and a host or interface processor 152 in communication with that PCIe interface. The host or interface processor 152 can be any type of processor known in the art that is suitable for the implementation. Host or interface processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces. Other embodiments can alternately or additionally include interfaces other than PCIe, such as Interlaken, for example.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
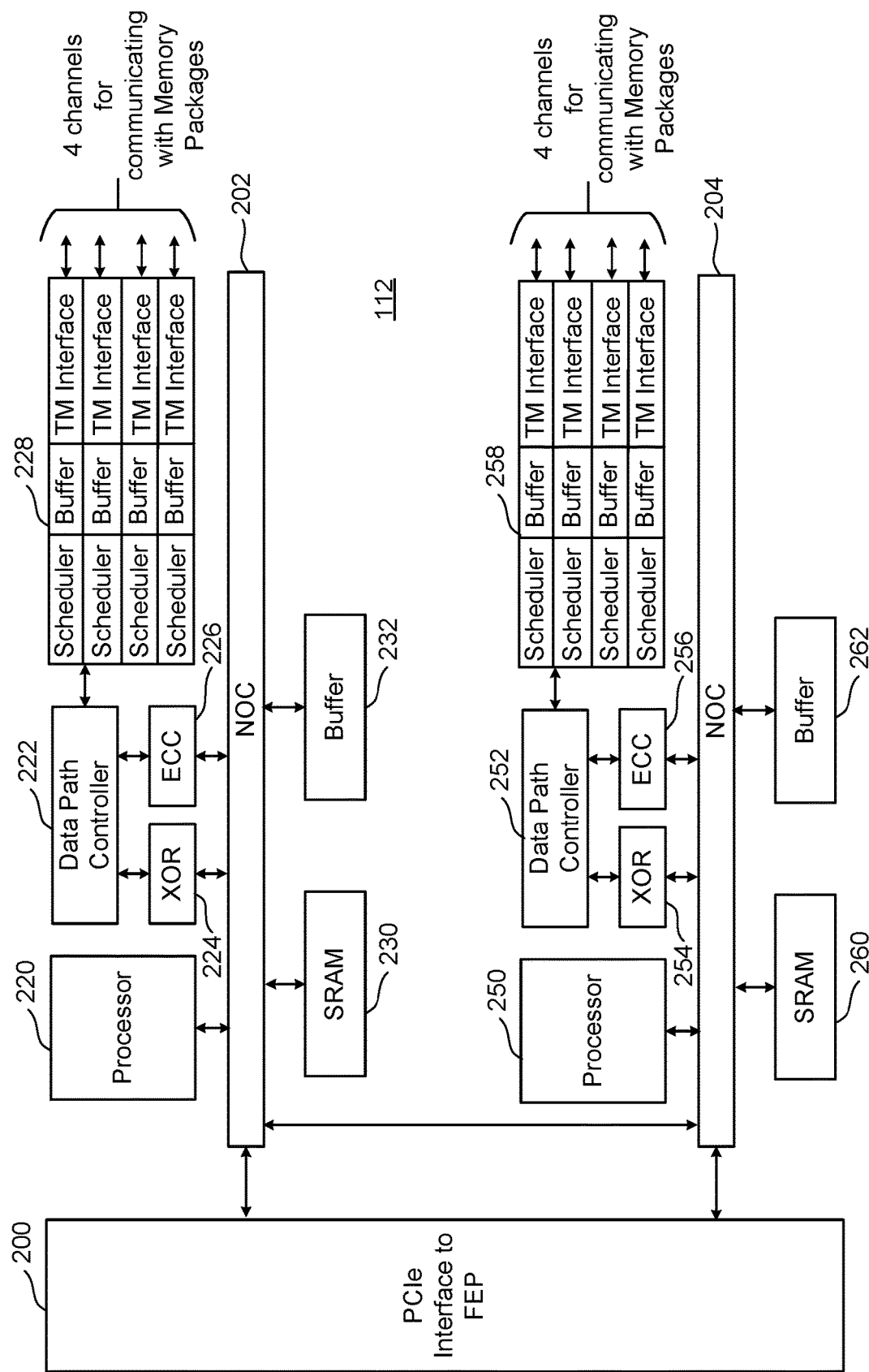
FIG. 3 is a block diagram of one embodiment of a Back End Processor Circuit. In some embodiments, the Back End Processor Circuit is part of a controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
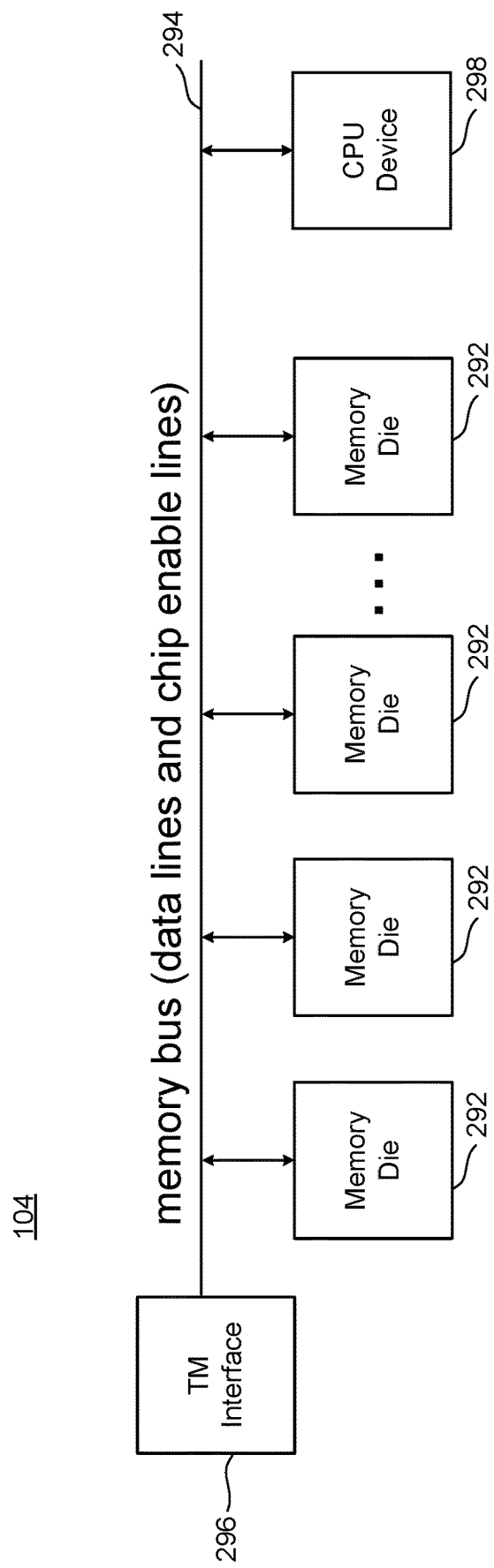
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. In some embodiments, the memory package can also include a processor, CPU device 298, such as a RISC-V CPU along with some amount of RAM to help implement some of capabilities described below. The technology described herein is not limited to any particular number of memory die.

Figure 5:
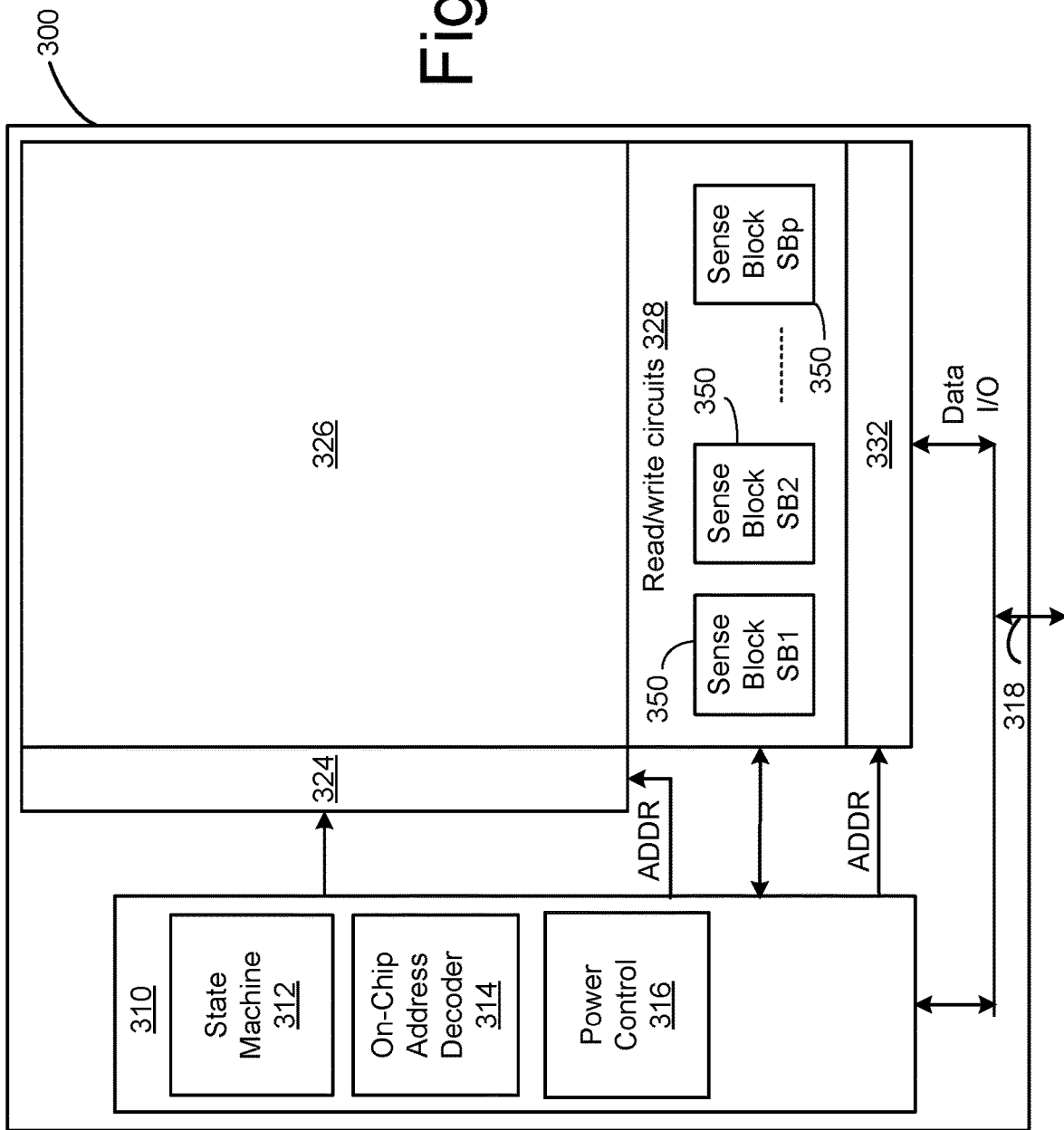
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 126 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, and a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" refers to a controller, a state machine, a micro-controller and/or control circuitry 310, or other analogous circuits that are used to control non-volatile memory.

In one embodiment, memory structure 326 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

The elements of FIG. 5 can be grouped into two parts, the memory structure 326 of the memory cells and the peripheral circuitry, including all of the other elements. An important characteristic of a memory circuit is its capacity, which can be increased by increasing the relative area of the memory die 300 that is given over to the memory structure 326; however, this reduces the area of the memory die 300 available for the peripheral circuitry. This can place quite serve restrictions on these peripheral elements. For example, the need to fit sense amplifier circuits within the available area can be a significant restriction on sense amplifier design architectures. With respect to the on-die control circuitry 310, reduced availability of area can limit the available functionalities that can be implemented on-chip. Consequently, a basic trade-off in the design of a memory die 300 is amount of area to devote to the memory structure 326 and the amount of area to devote to the peripheral circuitry.

Another area in which the memory structure 326 and the peripheral circuitry are often at odds is in the processing involved in forming these regions. Since these regions often involve differing processing technologies, there will be a trade-off in having differing technologies on a single die. For example, when the memory structure 326 is NAND flash, this is an NMOS structure, while the peripheral circuitry is often CMOS based. Sense amplifier circuits in the sense blocks 350, charge pumps in the power control block 316, logic elements in the state machine 312, and other peripheral circuitry often employ PMOS devices. Processing operations optimized for manufacturing a CMOS die will differ in many aspects from the processing operations optimized for an NMOS flash NAND memory or other memory cell technologies.

To improve upon these limitations, embodiments described below can separate the elements of FIG. 5 onto separately formed dies that are then bonded together. More specifically, the memory structure 326 can be formed on one die and some or all of the peripheral circuitry elements, including one or more control circuits, can be formed on a separate die. For example, a memory die can be formed of just the memory elements, such as the array of memory cells of flash NAND memory, a PCM memory, a ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two dies can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory dies and one peripheral circuitry die, for example.

Figure 6:
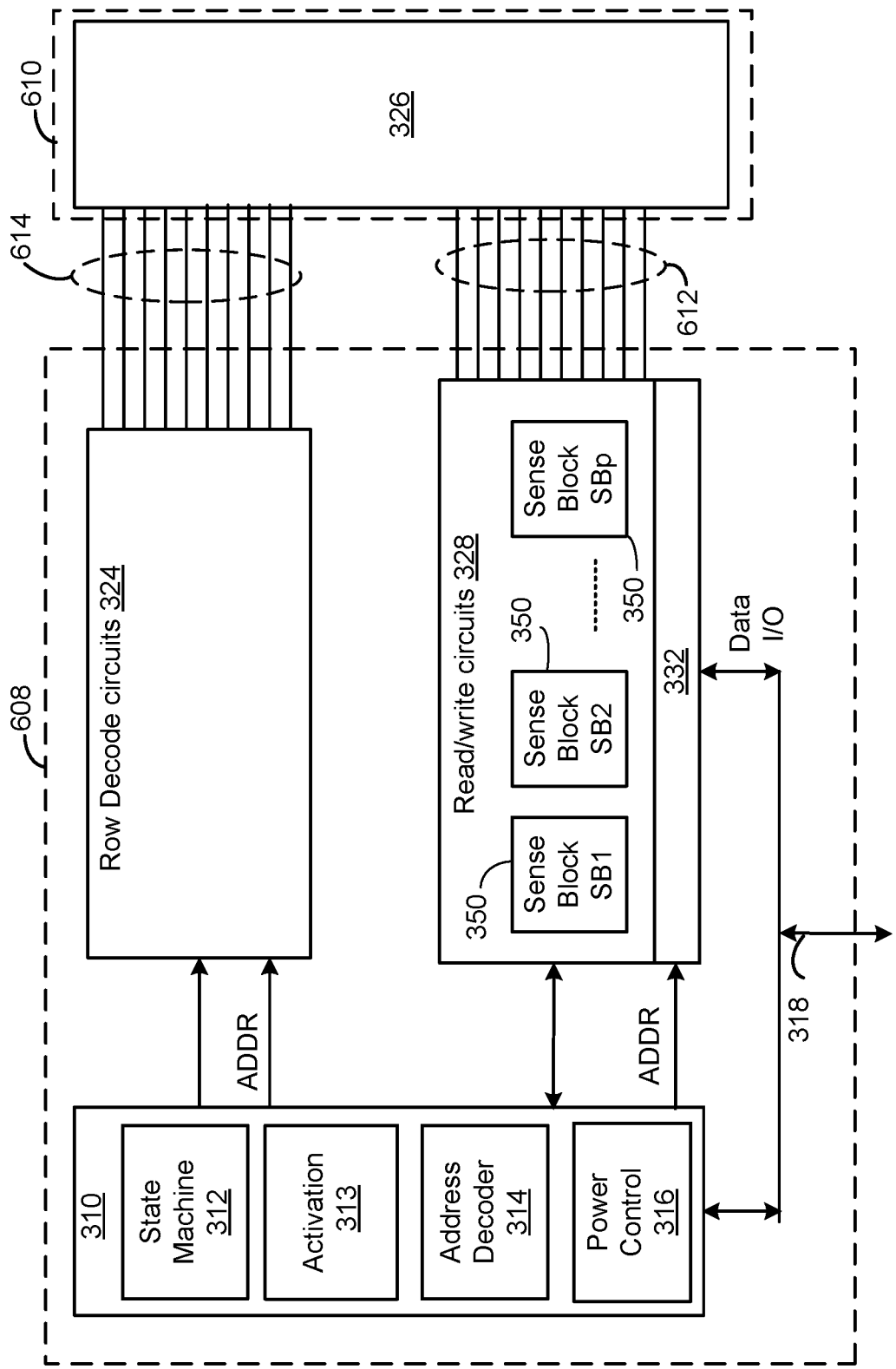
FIG. 6 shows an alternative arrangement to the arrangement of FIG. 5, which may be implemented using wafer-to-wafer bonding to provide a bonded die pair.

FIG. 6 shows an alternative arrangement to the arrangement of FIG. 5, which may be implemented using wafer-to-wafer bonding to provide a bonded die pair. FIG. 6 shows an example of the peripheral circuitry, including control circuits, formed in a peripheral or control circuit die 608 coupled to memory structure 326 formed in array die 610. Common components are numbered as in FIG. 5. It can be seen that control circuitry 310, read/write circuits 328, and row decoder 324 (which may be formed by a CMOS process) are located in control circuitry die 608. Additional elements, such as functionalities from controller 102 can also be moved into the control circuitry die 608. Control circuitry 310, read/write circuits 328, row decoder 324, and column decoder 332 may be formed by a common process (e.g. CMOS process), so that adding elements and functionalities more typically found on a memory controller 102 may require few or no additional process steps (i.e. the same process steps used to fabricate controller 102 may also be used to fabricate control circuitry 310, read/write circuits 328, and row decoder 324). Thus, while moving such circuits from a die such as memory die 300 may reduce the number of steps needed to fabricate such a die, adding such circuits to a die such as control circuitry die 608 may not require any additional process steps.

FIG. 6 shows read/write circuits 328 on the peripheral circuitry die 608 coupled to memory structure 326 on the memory circuit die 610 through electrical paths 612. For example, electrical paths 612 may provide electrical connection between read/write circuits 328 and bit lines of memory structure 326. Electrical paths may extend from read/write circuits 328 in control circuitry die 608 through pads on control circuitry die 608 that are bonded to corresponding pads of the memory circuit die 610, which are connected to bit lines of memory structure 326. Each bit line of memory structure 326 may have a corresponding electrical path in electrical paths 612, including a pair of bonded pads, that connects to read/write circuits 328. Similarly, row decoder circuits 324 are coupled to memory structure 326 through electrical paths 614. Each of electrical path 614 may correspond to a word line, dummy word line, or select gate line. Additional electrical paths may also be provided between control circuitry die 608 and memory array die 610.

Relative to FIG. 5, the on-die control circuits of FIG. 6 can also include addition functionalities within its logic elements, both more general capabilities than are typically found in the memory controller 102 and some CPU capabilities, but also application specific features. In some of the embodiments described below, this can include a wide range of activation functions, which determine the amplitude of the output, for use in the neural network operations described in the following and as represented at the activation logic block 313 of the on-die control circuit. For example, these activation functions can include addition and threshold determination operations used in the accumulation portion of Multiple and ACcumulation (MAC) operations. In some embodiments, the activation function can use multiple threshold determination using different threshold values to generate a multi-bit result. More generally, rather than a threshold determination, other embodiments can use other monotonically increasing (or non-decreasing) functions, such as more advanced operations such as sigmoid or tanh functions; additionally, more than one activation function can be applied sequentially.

In the following, state machine 312 and/or controller 102 (or equivalently functioned circuits), in combination with all or a subset of the other circuits depicted on the peripheral or control circuitry die 608 in FIG. 6 and similar elements in FIG. 5, can be considered part of the one or more control circuits that perform the functions described herein. For the neural network operations described below, these elements can operate in conjunction with the processor 892 and other elements of the read/write circuits 328 described in FIG. 8. The control circuits can include hardware only or a combination of hardware and software (including firmware). For example, a controller programmed by firmware to perform the functions described herein is one example of a control circuit. A control circuit can include a processor, FGA, ASIC, integrated circuit or other type of circuit.

As noted above, the memory structure 326 is typically structured as an array of memory cells formed along word lines and bit lines, where the word lines are addressable via a row decoder 324 and bit lines are addressable via a column decoder 332. To sense the state of the memory cells, the bit lines are connected to the read/write circuits 328 that include the multiple sense blocks 350 including SB1, SB2, . . . , SBp (sensing circuitry), allowing a page of memory cells to be read or programmed in parallel.

Figure 7:
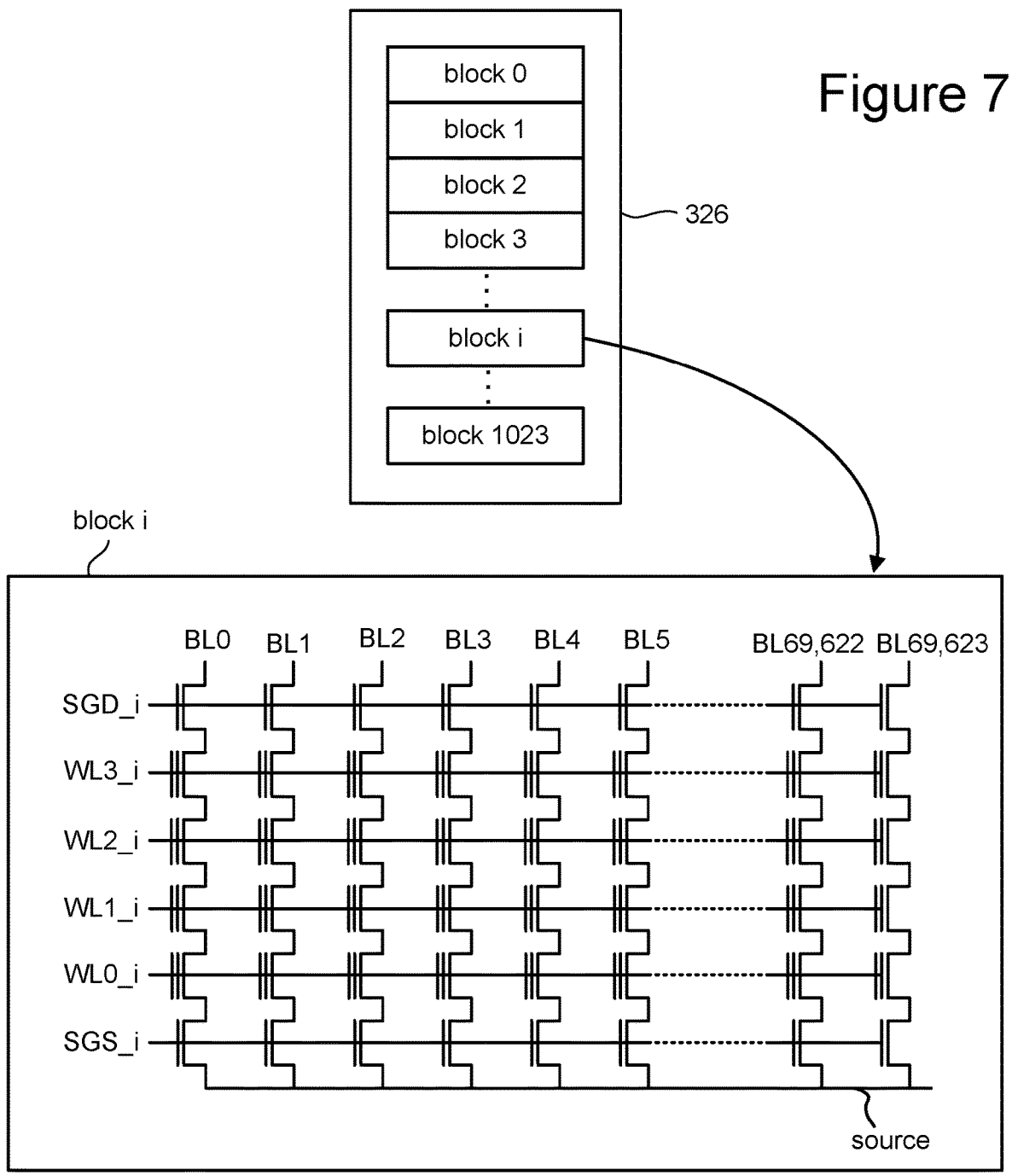
FIG. 7 depicts an example of a structure of memory cell array to illustrate an arrangement of memory cells along word lines and bit lines.

FIG. 7 depicts one example of a structure of memory cell array 326 to illustrate an arrangement of memory cells along word lines and bit lines. The example of FIG. 7 is for flash NAND type of memory, which can be either a two-dimensional or three-dimensional architecture. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used. For other memory technologies described above, such as storage class memory, including those based on ReRAM, PCM, or MRAM, the memory cells will again typically be connected along bit lines and word lines, with the resistive memory cells each connected between a corresponding bit line and word line.

A block contains a set of NAND stings which are accessed via bit lines (e.g., bit lines BL0-BL69, 623) and word lines (WL0, WL1, WL2, WL3). FIG. 7 shows four memory cells connected in series to form a NAND string. Although four cells are depicted to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming and a unit of reading, where the read page and the write page are often taken to be of the same size, although different pages sizes can be used for the different operations. Other units of programming and reading can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Besides NAND flash memory, other memory technologies and architectures, including PCM, MRAM, and others discussed above, can be used for the for the memory structure 326. Generally, however, they will be arranged along bit lines and word lines and/or other control lines. For any of these structures, when the memory cells are being sensed, this is typically done by considering a voltage level or current level on a memory cell's bit line in response to bias levels applied to the memory cell by the word lines and/or other control lines, where the sensing is performed by the Sense Blocks 350.

Figure 8:
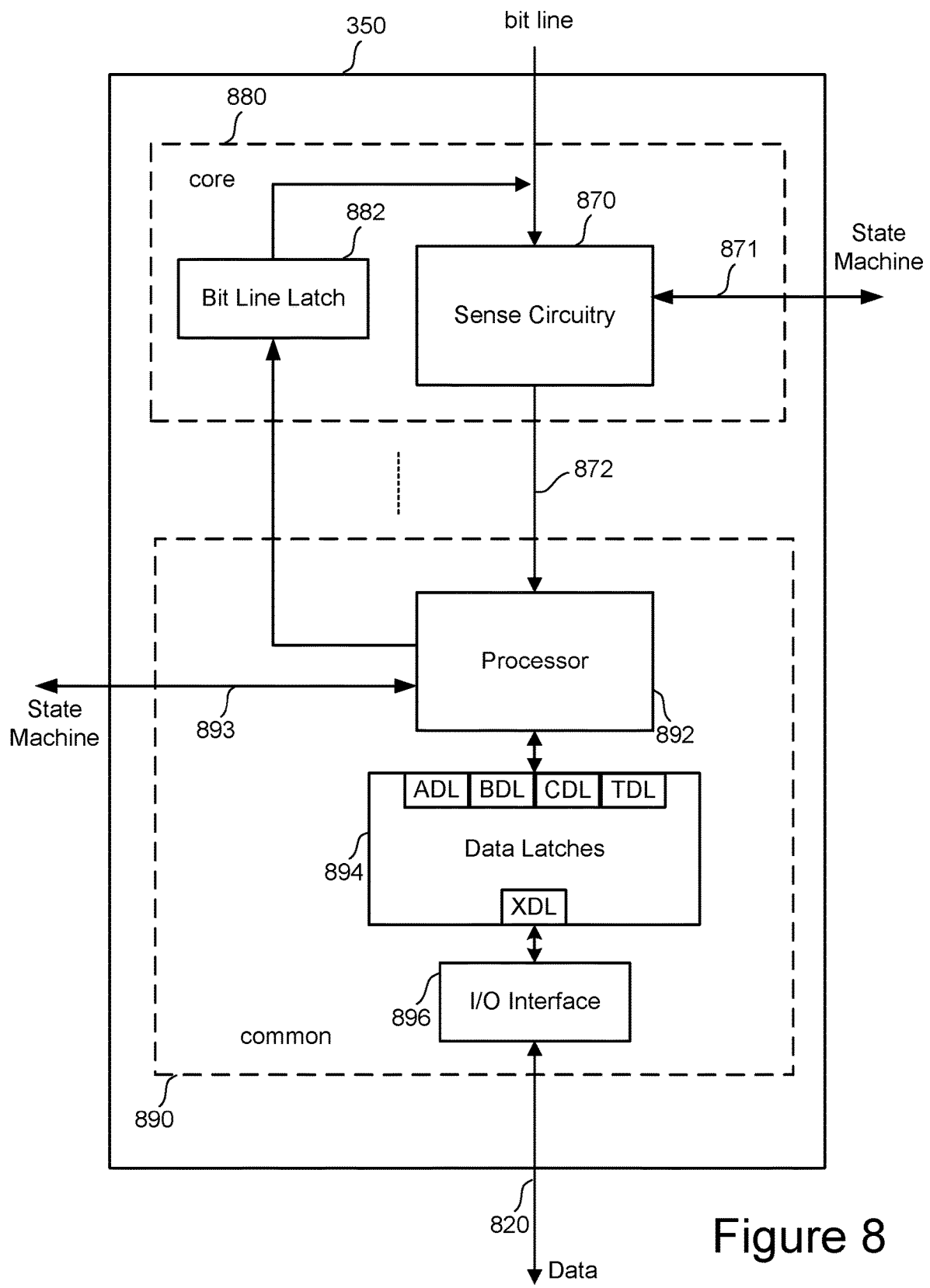
FIG. 8 is a block diagram of an individual sense block.

FIG. 8 is a block diagram for one embodiment of an individual sense block 350 partitioned into a core portion, referred to as a sense module 880, and a common portion 890. In one embodiment, there will be a separate sense module 880 for each bit line and one common portion 890 for a set of multiple sense modules 880. In one example, a sense block will include one common portion 890 and eight sense or sixteen modules 880. Each of the sense modules in a group will communicate with the associated common portion via a data bus 872.

Sense module 880 comprises sense circuitry 870 that determines whether a conduction current in a connected bit line is above or below a predetermined level or, in voltage based sensing, whether a voltage level in a connected bit line is above or below a predetermined level. The sense circuitry 870 is to received control signals from the state machine via input lines 871. In some embodiments, sense module 880 includes a circuit commonly referred to as a sense amplifier. Sense module 880 also includes a bit line latch 882 that is used to set a voltage condition on the connected bit line. For example, a predetermined state latched in bit line latch 882 will result in the connected bit line being pulled to a state designating program inhibit (e.g., Vdd).

Common portion 890 comprises a processor 892, a set of data latches 894 and an input/output (I/O) Interface 896 coupled between the set of data latches 894 and data bus 820. Processor 892 performs computations. For example, one of its functions is to determine the data stored in the sensed memory cell and store the determined data in the set of data latches. Processor 892 can form part of one or more control circuits used to perform the in-register operations discussed below. The set of data latches 894 is used to store data bits determined by processor 892 during a read operation. It is also used to store data bits imported from the data bus 820 during a program operation. The imported data bits represent write data meant to be programmed into the memory. I/O interface 896 provides an interface between data latches 894 and the data bus 820. The processors 892 of the one or more sense amplifiers 350 themselves or in combination with the state machine 312 and other control circuitry of FIG. 5 or 6 can be the one or more processing circuits described with respect to FIGS. 16-18.

During read or sensing, the operation of the system can be under the control of state machine 312 that controls (using power control 316) the supply of different control gate or other bias voltages to the addressed memory cell(s). As it steps through the various predefined control gate voltages corresponding to the various memory states supported by the memory, the sense module 880 may trip at one of these voltages and an output will be provided from sense module 880 to processor 892 via bus 872. At that point, processor 892 determines the resultant memory state by consideration of the tripping event(s) of the sense module and the information about the applied control gate voltage from the state machine via input lines 893. It then computes a binary encoding for the memory state and stores the resultant data bits into data latches 894. In another embodiment of the core portion, bit line latch 882 serves double duty, both as a latch for latching the output of the sense module 880 and also as a bit line latch as described above.

Data latch stack 894 contains a stack of data latches corresponding to the sense module. In one embodiment, there are three, four or another number of data latches per sense module 880. In one embodiment, the latches are each one bit. In this document, the latches in one embodiment of data latch stack 894 will be referred to as XDL, ADL, BDL, and CDL. In the embodiments discussed here, the latch XDL is a transfer latch used to exchange data with the I/O interface 896. The latches ADL, BDL and CDL can be used to hold multi-state data, where the number of such latches typically reflects the number of bits stored in a memory cell. For example, in 3-bit per cell multi-level cell (MLC) memory format, the three sets of latches ADL, BDL, CDL can be used for upper, middle, lower page data. In 2-bit per cell embodiment, only ADL and BDL might be used, while an 8-bit per cell MLC embodiment might include a further set of DDL latches. The following discussion will mainly focus on a 3-bit per cell embodiment, as this can illustrate the main features but not get overly complicated, but the discussion can also be applied to embodiments with more or fewer bit per cell formats. Some embodiments many also include additional latches for particular functions, such as represented by the TDL latch where, for example, this could be used in "quick pass write" operations where it is used in program operations for when a memory cell is approaching its target state and is partially inhibited to slow its programming rate. In embodiments discussed below, the latches ADL, BDL, . . . can transfer data between themselves and the bit line latch 882 and with the transfer latch XDL, but not directly with the I/O interface 896, so that a transfer from these latches to the I/O interface is transferred by way of the XDL latches. In the following, the latch structure of the data latch stack 894 can be taken to correspond to the buffers illustrated in FIG. 16 and used in the operations of FIGS. 17 and 18.

For example, in some embodiments data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In other embodiments, as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL, and similarly for BDL and CDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster.

During program or verify, the data to be programmed is stored in the set of data latches 894 from the data bus 820. During the verify process, Processor 892 monitors the verified memory state relative to the desired memory state. When the two are in agreement, processor 892 sets the bit line latch 882 so as to cause the bit line to be pulled to a state designating program inhibit. This inhibits the memory cell coupled to the bit line from further programming even if it is subjected to programming pulses on its control gate. In other embodiments, the processor initially loads the bit line latch 882 and the sense circuitry sets it to an inhibit value during the verify process.

In some implementations (but not required), the data latches are implemented as a shift register so that the parallel data stored therein is converted to serial data for data bus 820, and vice versa. In one embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

A person of ordinary skill in the art will recognize that the technology described herein is not limited to a single specific memory structure, but covers many relevant memory structures within the spirit and scope of the technology as described herein and as understood by one of ordinary skill in the art.

Turning now to types of data that can be stored on non-volatile memory devices, a particular example of the type of data of interest in the following discussion is the weights used is in artificial neural networks, such as convolutional neural networks or CNNs. The name "convolutional neural network" indicates that the network employs a mathematical operation called convolution, that is a specialized kind of linear operation. Convolutional networks are neural networks that use convolution in place of general matrix multiplication in at least one of their layers. A CNN is formed of an input and an output layer, with a number of intermediate hidden layers. The hidden layers of a CNN are typically a series of convolutional layers that "convolve" with a multiplication or other dot product.

Each neuron in a neural network computes an output value by applying a specific function to the input values coming from the receptive field in the previous layer. The function that is applied to the input values is determined by a vector of weights and a bias. Learning, in a neural network, progresses by making iterative adjustments to these biases and weights. The vector of weights and the bias are called filters and represent particular features of the input (e.g., a particular shape). A distinguishing feature of CNNs is that many neurons can share the same filter.

Figure 9:
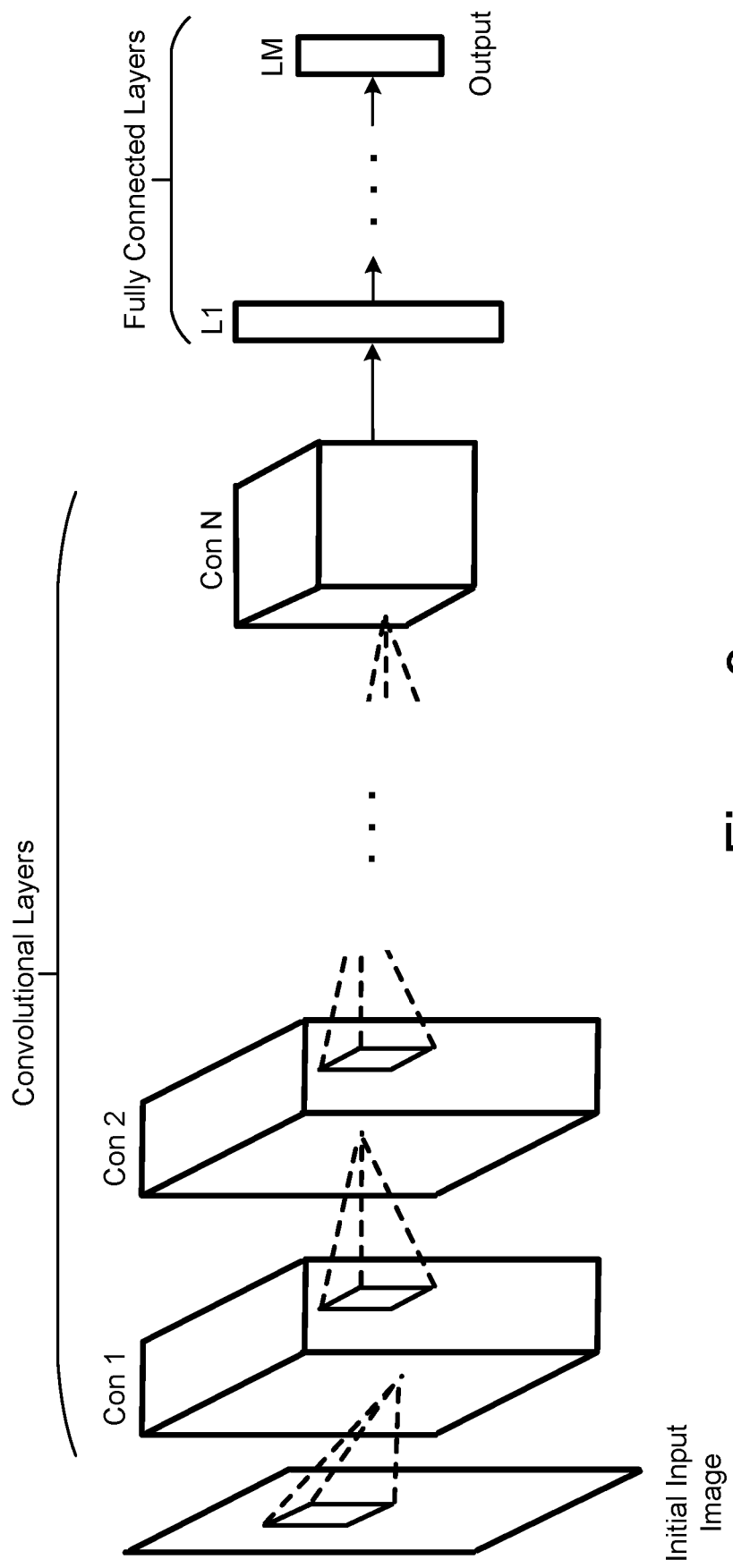
FIG. 9 is a schematic representation of an example of a convolutional neural network (CNN).

FIG. 9 is a schematic representation of an example of a CNN. FIG. 9 illustrates an initial input image of an array of pixel values, followed by a number convolutional layers that are in turn followed by a number of fully connected layers, the last of which provides the output. Each neuron in the first convolutional layer (Con 1) takes as input data from an n×n pixel sub-region of the input image. The neuron's learned weights, which are collectively referred to as its convolution filter, determine the neuron's single-valued output in response to the input. In the convolutional layers, a neuron's filter is applied to the input image by sliding the input region along the image's x and y dimensions to generate the values of the convolutional layer. In practice, the equivalent convolution is normally implemented by statically identical copies of the neuron to different input regions. The process is repeated through each of the convolutional layers (Con 1 to Con N) using each layer's learned weights, after which it is propagated through the fully connected layers (L1 to LM) using their learned weights.

Figure 10:
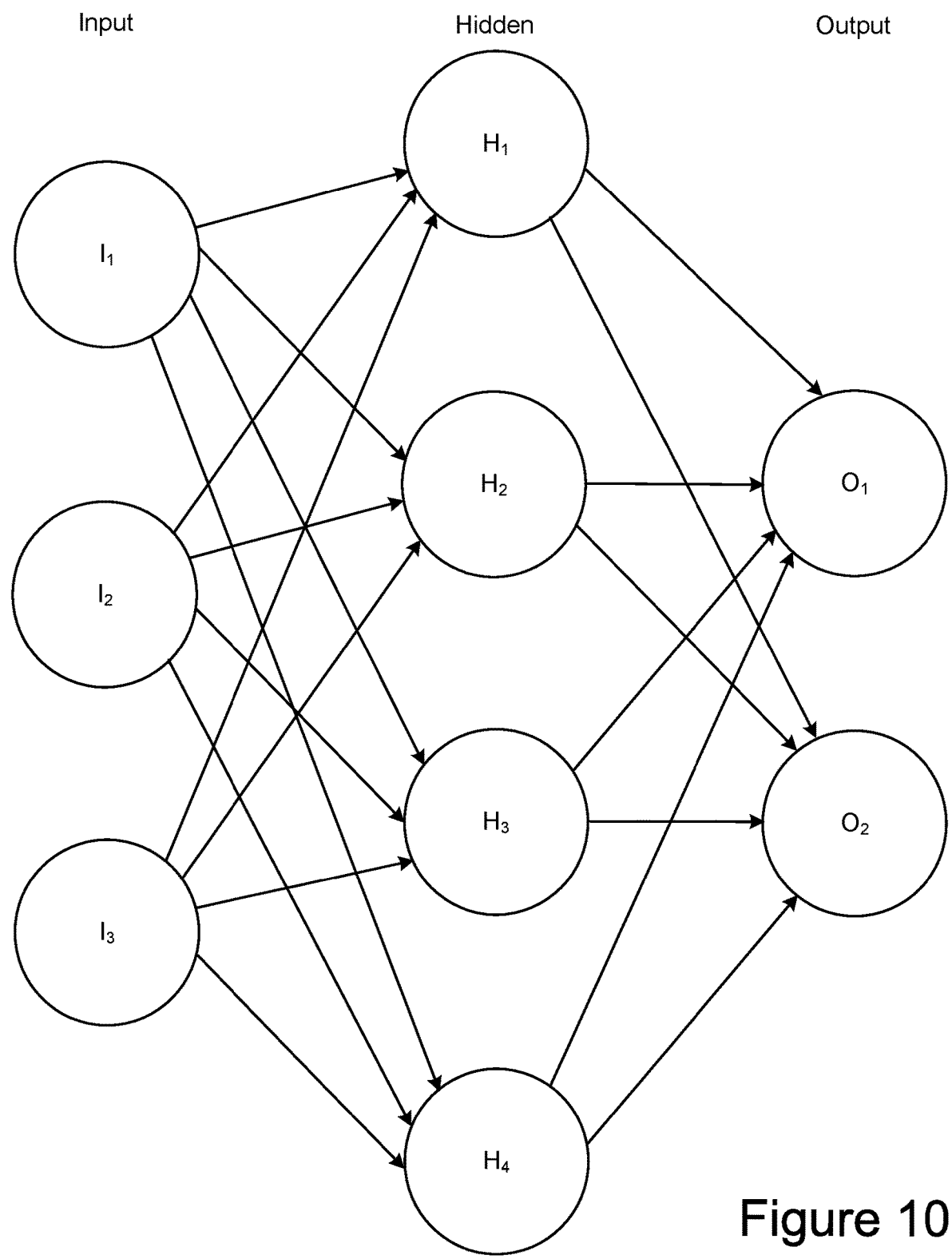
FIG. 10 represents several fully connected layers of a neural network in more detail.

FIG. 10 represents several fully connected layers of a neural network in more detail. In FIG. 10, the shown three layers of the artificial neural network are represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons/synapses, of the artificial neural network are implemented by logic elements of a host or other processing system as a mathematical function that receives one or more inputs and sums them to produce an output. Usually each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a weight that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer), to the last layer (the output layer), possibly after traversing the layers multiple times. Although FIG. 10 shows only a single intermediate or hidden layer, a complex deep neural network (DNN) can have many such intermediate layers.

A supervised artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

FIG. 11A is a flowchart describing one embodiment of a process for training a neural network to generate a set of weights. The training process is often performed in the cloud, allowing additional or more powerful processing the accessed. At step 1101, the input, such as a set of images, is received (e.g., the image input in FIG. 9). At step 1103 the input is propagated through the layers connecting the input to the next layer (e.g., CON1 in FIG. 9 using the current filter, or set of weights. The neural network's output is then received at next layer (e.g., CON2 in in FIG. 9) in step 1105, so that the values received as output from one layer serve as the input to the next layer. The inputs from the first layer are propagated in this way through all of the intermediate or hidden layers until they reach the output. In the dog breed example of the preceding paragraph, the input would be the image data of a number of dogs, and the intermediate layers use the current weight values to calculate the probability that the dog in an image is a certain breed, with the proposed dog breed label returned at step 1105. A user can then review the results at step 1107 to select which probabilities the neural network should return and decide whether the current set of weights supply a sufficiently accurate labelling and, if so, the training is complete (step 1111). If the result is not sufficiently accurate, the neural network adjusts the weights at step 1109 based on the probabilities the user selected, followed by looping back to step 1103 to run the input data again with the adjusted weights. Once the neural network's set of weights have been determined, they can be used to "inference," which is the process of using the determined weights to generate an output result from data input into the neural network. Once the weights are determined at step 1111, they can then be stored in non-volatile memory for later use, where the storage of these weights in non-volatile memory is discussed in further detail below.

FIG. 11B is a flowchart describing a process for the inference phase of supervised learning using a neural network to predict the "meaning" of the input data using an estimated accuracy. Depending on the case, the neural network may be inferenced both in the cloud and by an edge device's (e.g., smart phone, automobile process, hardware accelerator) processor. At step 1121, the input is received, such as the image of a dog in the example used above. If the previously determined weights are not present in the device running the neural network application, they are loaded at step 1122. For example, on a host processor executing the neural network, the weights could be read out of an SSD in which they are stored and loaded into RAM on the host device. At step 1123, the input data is then propagated through the neural network's layers. Step 1123 will be similar to step 1103 of FIG. 11A, but now using the weights established at the end of the training process at step 1111. After propagating the input through the intermediate layers, the output is then provided at step 1125.

Neural networks are typically feedforward networks in which data flows from the input layer, through the intermediate layers, and to the output layer without looping back. At first, in the training phase of supervised learning as illustrated by FIG. 11A, the neural network creates a map of virtual neurons and assigns random numerical values, or "weights", to connections between them. The weights and inputs are multiplied and return an output between 0 and 1. If the network does not accurately recognize a particular pattern, an algorithm adjusts the weights. That way the algorithm can make certain parameters more influential (by increasing the corresponding weight) or less influential (by decreasing the weight) and adjust the weights accordingly until it determines a set of weights that provide a sufficiently correct mathematical manipulation to fully process the data.

Figure 12:
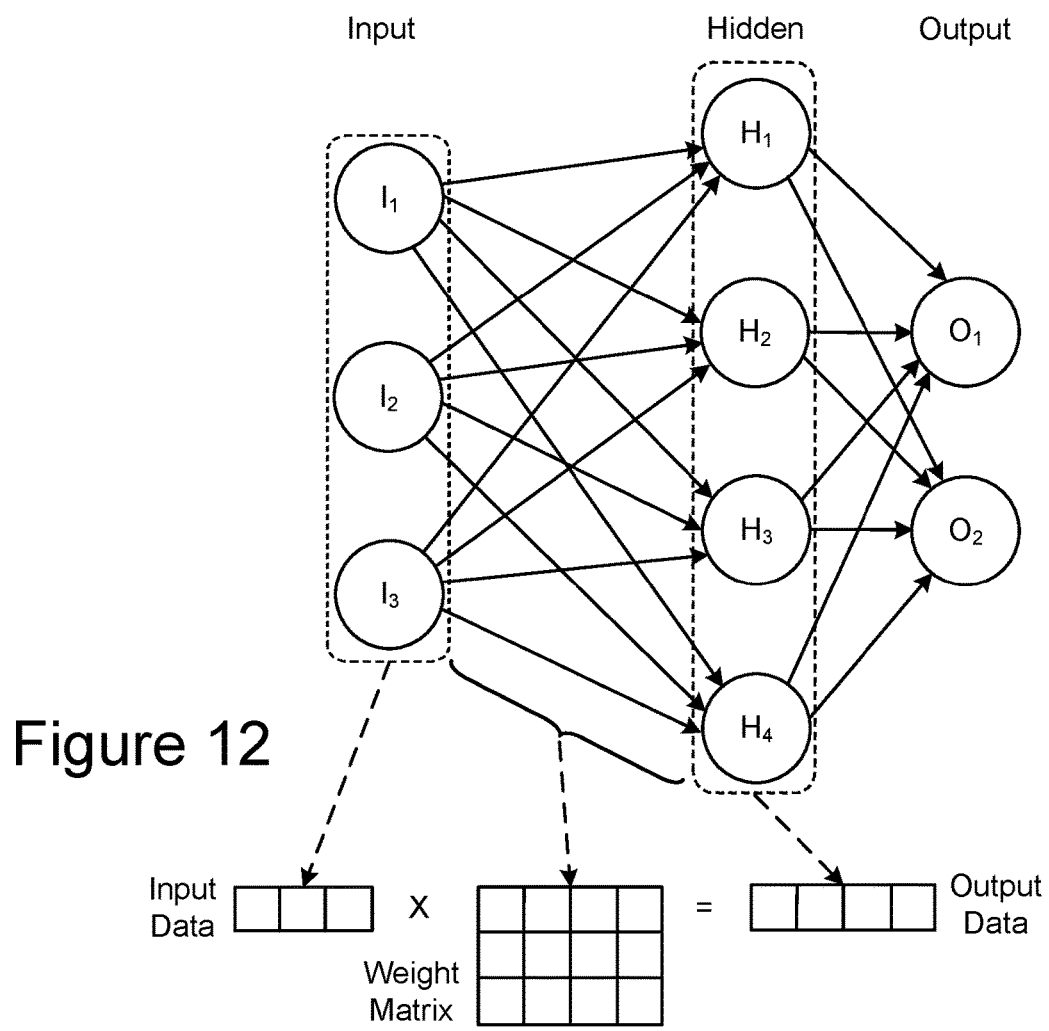
FIG. 12 is a schematic representation of the use of matrix multiplication in a neural network.

FIG. 12 is a schematic representation of the use of matrix multiplication in a neural network. Matrix multiplication, or MatMul, is a commonly used approach in both the training and inference phases for neural networks and is used in kernel methods for machine learning. FIG. 12 at top is similar to FIG. 10, where only a single hidden layer is shown between the input layer and the output layer. The input data is represented as a vector of a length corresponding to the number of input nodes. The weights are represented in a weight matrix, where the number of columns corresponds to the number of the number of intermediate nodes in the hidden layer and the number of rows corresponds to the number of input nodes. The output is determined by a matrix multiplication of the input vector and the weight matrix, where each element of the output vector is a dot product of the vector of the input data with a column of the weight matrix.

Figure 13:
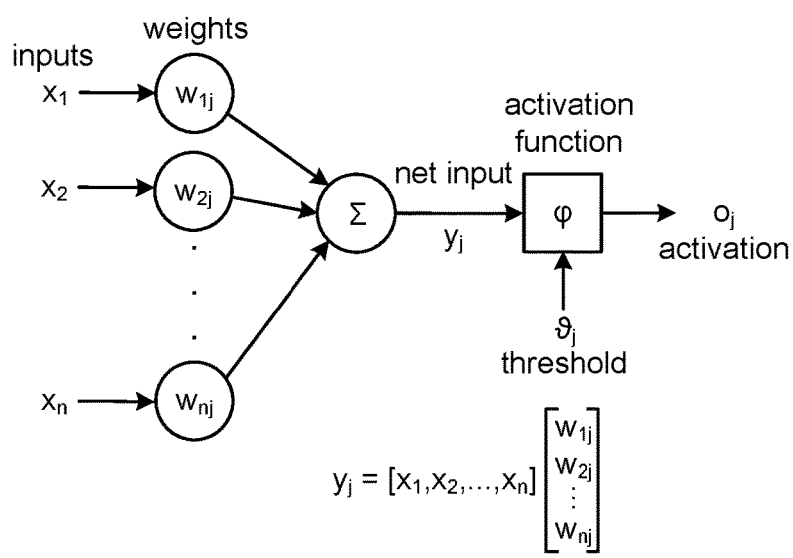
FIG. 13 illustrates a vector multiplication of weights and input vectors and activation based on a threshold.

FIG. 13 illustrates a vector multiplication of weights and input vectors and activation based on a threshold. At each layer, a vector of input values of n $x_i$ values is multiplied component by component with n weight values $w_{ij}$ over index i and summed by a transfer function to provide the outputs $y_j$, where the number of j values corresponds to the number of nodes in the next layer. The $y_j$ values are then input to an activation function, where an activation function controls the amplitude of the output based on the input value. In FIGS. 12 and 13, the input is shown as a vector for a fully connected layer of a network. For convolutional layers, the inputs will typically be matrices, but the same techniques can be used by summing over both indices of an input matrix or rearranging the matrix into a vector representation (e.g., for a 3×4 matrix, stacking the four three component columns into a twelve component vector).

A number of functions can be used, depending on the embodiment and the model for the neural network. A common activation function is whether or not the input ($y_j$) to the activation exceeds a threshold value, $\theta_j$, to provide an activation value $o_j$ which can be 1 if $y_j$ meets or exceeds the corresponding $\theta_j$, and 0 otherwise. Much of the following discussion will use the example of a threshold activation functions, but it will be understood that more general functions can be used. The activation values can then be used as the inputs to the next layer's weights.

A common technique for executing the matrix multiplications is by use of a multiplier-accumulator (MAC, or MAC unit). However, this has a number of issues. Referring back to FIG. 11B, the inference phase loads the neural network weights at step 1122 before the matrix multiplications are performed by the propagation at step 1123. However, as the amount of data involved can be extremely large, use of a multiplier-accumulator for inferencing has several issues related to loading of weights. One of these is high energy dissipation due to having to use large MAC arrays with the required bit-width. Another is high energy dissipation due to the limited size of MAC arrays, resulting in high data movement between logic and memory and an energy dissipation that can be much higher than used in the logic computations themselves.

To help avoid these limitations, the use of a multiplier-accumulator array can be replaced with other memory technologies. For example, the matrix multiplication can be computed within a memory array and its peripheral circuit by leveraging the characteristics of non-volatile memories, such as NAND memory or storage class memory, such as those based on ReRAM, PCM, or MRAM based memory cells. This allows for the neural network inputs to be loaded into the data latch structures of the array and the neural weights to be preloaded into the array, from where they can also be read into the data latch structures for inferencing within the latch structures. By use of in-memory computing, this can remove the need for logic to perform the matrix multiplication in a MAC array and the need to move data between the memory and the MAC array.

The following considers embodiments based on memory arrays, such as a of NAND type of architecture, in which weights are stored as pages of data. To perform an inferencing operation, the weight of a layer is read out into a page buffer within the array's latch structure. The input of the layer can be read into another latch within the array's latch structure and the multiplication of the input and weights can then be performed within the latch structure by performing bit-wise logical operations between the weights in the page buffer and the input values in the corresponding latch. The results can then be summed, activation performed, and output values determined, all within the latch structure of the array. In contrast to MAC array logic, use of the memory array and its corresponding latch structures shows several advantages, including a much higher area/bit value, a much higher throughput rate, and a significant reduction in energy dissipation due to minimizing data movement by performing in-array multiplication.

FIGS. 14 and 15 illustrate examples of the use of binary values in a neural network. A technique that can be used to reduce the computational complexity of the inference process is by use of a Binarized Neural Network (BNN), in which a neural network works with binary weights and activations. A BNN (also called an XNOR-Net) computes the matrix-vector multiplication with "binary" inputs {−1, +1} and "binary" weights {−1, +1}. FIG. 14 is a table illustrating the output of a binary neural network in response to the different input-weight combinations. As shown in the right-most column, when the input and weight match, the output is +1; and when the input and the weight differ, the output is −1. FIG. 15 is a table illustrating the output of a binary neural network in response to the different input-weight combinations when the {−1, +1} values of FIG. 14 are mapped to the values {0, 1}. As can be seen from the output values, the mapping of the input and weight values allows for the output to implements as an exclusive NOR operation, giving a 1 when the input and output match and a 0 when they differ.

The following discussion presents embodiment that can accelerate the operation of binary neural networks, or BNNs, using the memory array and associated data latch structures of non-volatile memory devices. More specifically, the weight matrices in BNNs are binary valued (−1, +1), while the input values may be multi-valued (−N to +N) or binary valued (−1, +1). Matrix multiplications of the weight and input vectors in this form can be simplified to a series of XNOR operations with an appropriate mapping of the {−1, +1} values to {0, 1} as described with respect to FIGS. 14 and 15. The multiplication of weights and inputs can be performed with the data latch structures of the memory array. After the multiplication computation is carried out, an activation function can be applied on the resulting sum of the binary weights, again within the latch structure. Although many described in the context of a binary weight, binary input embodiment, these techniques can be extended to more general neural networks, such as when the inputs and/or weights are ternary, {−1, 0, +1}, or multi-bit values.

Aspects described in the following can make use of internal functions on non-volatile memory devices to compute the neuron output. Memory devices, such as NAND devices, can implement special mode commands that allow a variety of arithmetical and logical operations on the contents of the internal buffers and latches illustrated in FIG. 8 in the non-volatile memory device of FIGS. 5 and 6. In particular, a command can be used to allow bitwise logical operations such as AND, OR, XNOR, INV among buffers like the page buffer, XDL, ADL, and other latches of the data latch structure 894 of FIG. 8. Another command is a BitScan command that can be used to count the number of bits set in the buffer. These capabilities can be invoked over the command interface by the external host controller.

Among the features used in the following are the use of an XNOR command to "multiply" an input vector and a weight vector or matrix. A BitScan command is used to count the number of bits set in the buffer holding the result of the "multiply" operation, thereby mimic the summation at the end of a vector multiplication. A threshold function can be used to implement a simple activation function, where the BitScan result can be compared against a threshold setup prior to the BitScan, resulting in a PASS or FAIL output which can be mapped to a "0" or "1" as the output of the activation function.

Figure 16:
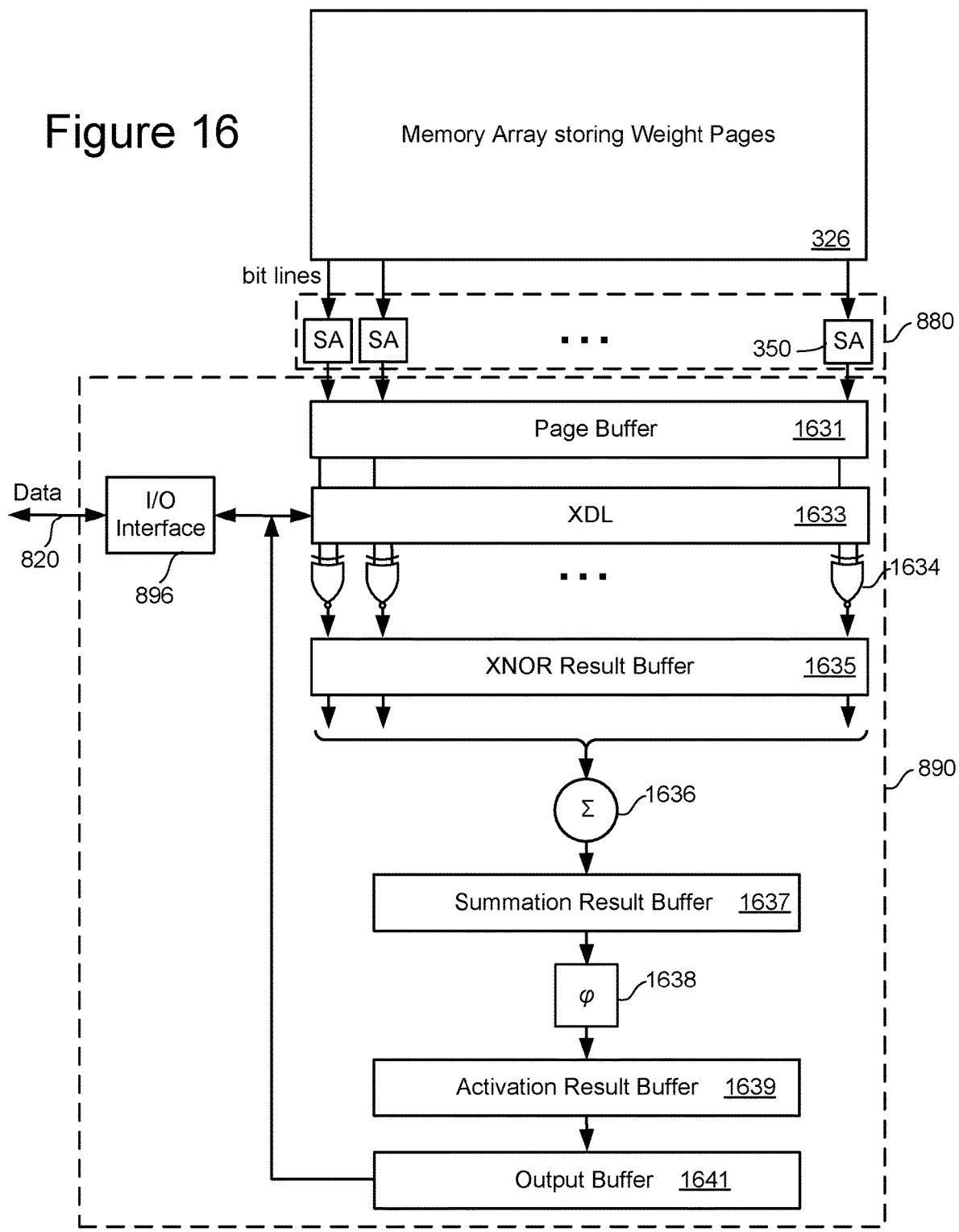
FIG. 16 is a block diagram of an embodiment for performing neural network operations within the latch structure of a non-volatile memory device.

FIG. 16 is a block diagram of an embodiment for performing neural network operations within the latch structure of a non-volatile memory device. More specifically, FIG. 16 includes a non-volatile memory array 326 and read/write circuits 328, including multiple sense blocks 350, where this can be a memory die 300 as in FIG. 5 or a bonded die pair as in FIG. 6, with the array on the memory die 610 and the read/write circuits 328 on the CMOS die, or more generally a peripheral or control circuitry die, 608. In FIG. 16, a schematic representation of an embodiment of the latch structure portion 894 of the common portions 890 of the read/write circuits 328 is shown in more detail. The I/O interface 896 is also shown, as are some other relevant functions that can be performed by the logic circuitry of the processor sections 892, where the processors 892 of the one or more sense amplifiers 350 themselves or in combination with the state machine 312 and other control circuitry of FIG. 5 or 6 can be the one or more processing circuits described with respect to FIGS. 16-18.

In FIG. 16, the memory array 326 stores weights of a neural network. In the embodiment primarily described in the following, these are weights of a binary neural network stored a binary format in single level memory cell (SLC) memory. Other embodiments can have multi-bit weight values, with the weights stored multi-level cell (MLC), in multiple memory cells, or both. For example, support for multi-bit input or/and weight precision, say 4 or 8 bit, can be implemented by assigning multiple word-lines or/and bit-lines to each input or/and weight value, so that, in effect, the multiply operation is replaced by summation. Each of the pages of the memory array (e.g., a word line) can store a portion of one or more weights of the neural network. In some embodiments, the weight vectors can be protected by ECC to avoid loss of accuracy due to read disturbs or other failure mechanisms. For example, one weight can be stored on a page, with the unused part of page padded with 0s if the weight does not fill out the full page. In some embodiments, if the weight size is larger than the page size, a weight vector can be spread across several pages. In other embodiments, several weight vectors might be stored on a single page. The sense amplifiers 350 read out a page of data and store the result in a read buffer 1631. To simplify the following discussion, a page will usually be taken as corresponding to a single weight vector and the buffer 1631 will be referred to as a page buffer in the following discussion.

The latch structure of the common portion 890 includes a number of buffers and latches (where here these terms are largely used interchangeably in the following) that formed of the latches in the data latches section 894. The latch structure formed of the data latch circuits 894 in the one or more sense amplifiers can be used for the buffers of FIG. 16, where each of the buffers can be formed of a set of individual latch circuits. For example, the transfer latch XDL 1633 here refers to the buffer formed of the collection of individual XDL latches described with respect to FIG. 8. Among the buffers represented in the common portion 890 is the page buffer 1631 in which the sense amplifiers of 350 store the result of the sensing operations of the corresponding bit lines of a page of data. In some embodiments, partial pages can be read and the operations described here can be performed on partial pages. The page buffer 1631 stores weights of a layer of a neural network as read out of the memory array 326.

The latches of the transfer buffer XDL 1633 are configured to exchange data with the data bus by way of the I/O interface 896. The inputs to the neural network can be provided over the I/O interface 896 and stored in the transfer buffer XDL 1633. With the inputs to a layer of the neural network in the XDL buffer 1635 and the layer's weights in the page buffer 1631, the multiplication between the inputs and weights, along with many or all of the other operations for propagating an input through the layers of a neural network in an inferencing operation, can be performed within the latch structure, minimizing the need to transfer data across the I/O interface 896 and greatly accelerating the process.

The multiplication of input values with the weights can be performed by bit-wise exclusive not OR (XNOR) operation (or, more generally, other bit-wise arithmetical operation) of the values of the page buffer 1631 and the transfer buffer XDL 1633 using an XNOR function of one or more processing circuits 892, as represented by the XNOR gates 1634. The XNOR function and other functions describe below for the neural network operations (summing, activation) can be performed by logic elements and other circuitry within the processors 892 in the read/write circuits 328. The processors 892 in the read/write circuits 328, along with the state machine 312 and other elements of the on-die control circuit 310, can be one or more control circuits or more processing circuits for performing the described neural network operations. The XNOR results can then be stored in the result buffer 1635, where this can be a separate set of latches as illustrated or the result can be written back into the page buffer 1631; that is, the result buffer 1635 can be the same as the page buffer 1631 in some embodiments. As described with respect to FIG. 15, the XNOR-ing corresponds to the multiplication of the weights and inputs for a network layer. The summation of the contents of the result buffer can be performed by the logic of the one or more processing circuits 892, such as in a bit scan operation and as represented by the summation block 1636. The result of summation block is the dot-, or inner-, product of the input and weights of a layer, corresponding to the $y_j$ value of FIG. 13. The result of the summation can then be stored in a summation result buffer 1637.

The one or more processing circuits 892 section can then perform activation on the values in the summation buffer 1637, as represented by the activation block 1638. For example, this can be a threshold determination by comparing the result to threshold values as represented as $\theta_j$ in FIG. 13. For example, these values can be supplied along with weight values over the I/O interface 896. Depending on the embodiment, other, more complex activations can be performed within the latch structure by the one or more processing circuits 892. In some embodiments, activation or additional activation can be done by transferring the summation results out of the latch structure through the I/O interface 896 to be performed by peripheral circuitry, such as the activation block 313 in the on-die control circuitry.

The results of the activation operations from activation block 1638 (or summation block 1636 if activation is not done in the latch structure) can be saved in the output buffer 1641. The results of a number of input-multiplications can be saved in the output buffer 1641, such as all of the multiplications of a layer of the neural network. The contents of the output buffer can then be transferred out over the I/O interface 896 or loaded back into the transfer buffer XDL 1633, where it can serve as the input to the next layer of the neural network. Although shown as separate in FIG. 16, the transfer buffer XDL 1633 can be used as the output buffer 1641.

The embodiment illustrated in FIG. 16 shows XNOR logic in XNOR blocks 1634 and counts the number of is in the summation block 1636, but it will be understood that other implementations can be used. For example, an alternate embodiment could use a bit-wise XOR-ing of the weights and inputs for layer for the multiplication/comparison, followed by counting the resultant number of 0s, or through other similar logical implementations to perform a bit-wise multiplication or other bit-wise arithmetical operation and subsequent summation of the weights in the page buffer 1631 and input in the transfer buffer 1633. Other examples of the use of arithmetical operations besides the XNOR logic 1634 can include AND, OR, and XOR, for example, in which case it will be understood that the buffer 1635 will store the corresponding result. Other embodiments can use more unusual networks/architectures/operations can be constructed out of simple arithmetical operations, such as: [(Weight XOR Input) AND MaskBuffer]; or [(Weight1 XOR Input1) OR/XOR/AND (Weight2 XOR Input2)].

With respect to the summation block 1638, depending on the embodiment the sum can be a count of 1s or a count of 0s. As noted, the size of a weight or an input can be less than the full range of the page buffer 1631 and XDL buffer 1633, in which the sum can only be of a range (or segment) of these buffers, rather than the full extent of the buffers. Additionally, in some embodiments the summation can also be less than the full size of the weight in the page buffer 1631, the full size of the input value in the XDL buffer 1633, or both. In some embodiments, multiple sums can be counted over multiple segments of the buffers. For example, multiple summations could be computed on multiple ranges of buffers simultaneously. For example, this be done when the page buffer holds multiple weight values in different ranges.

Figure 17:
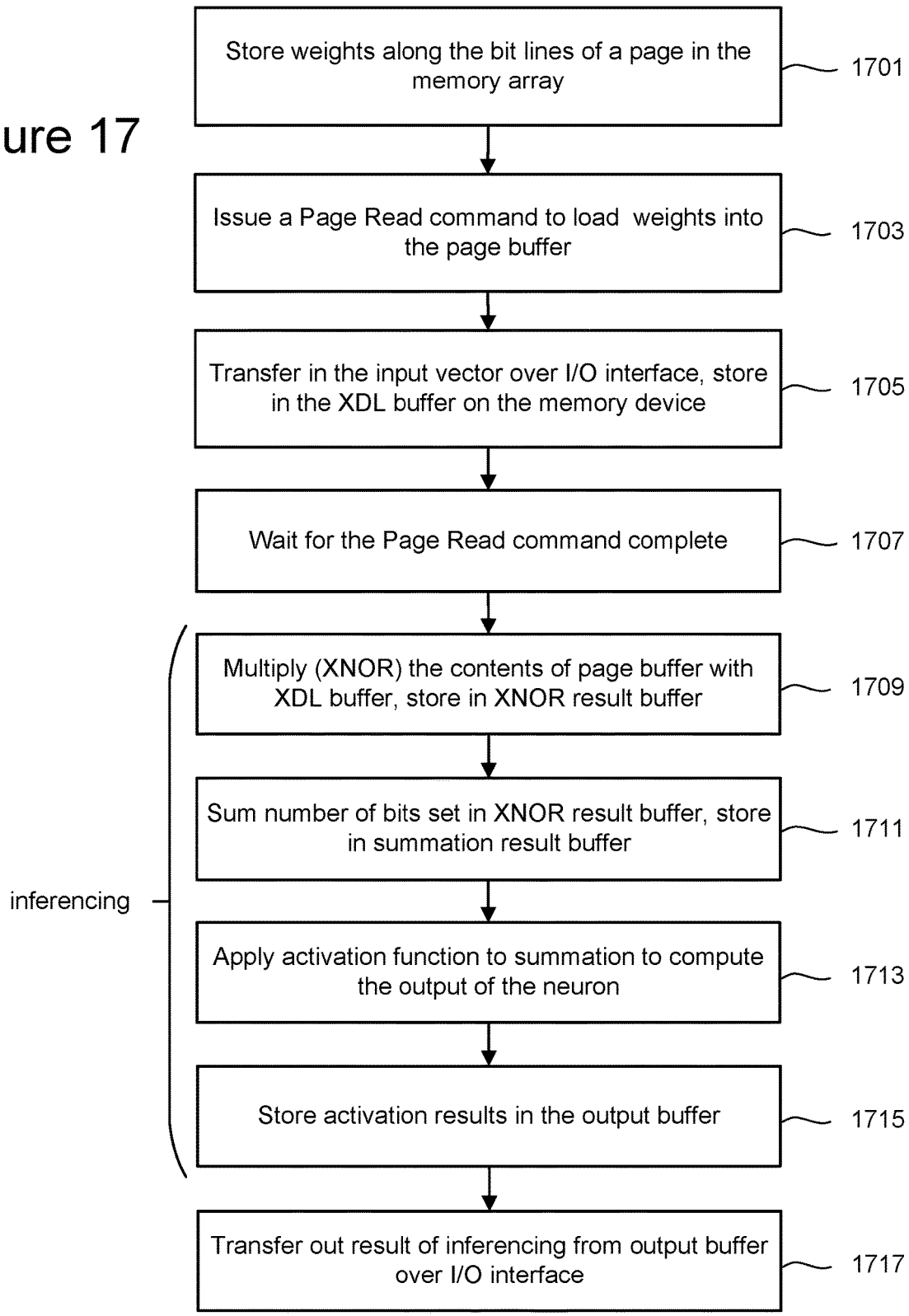
FIG. 17 is a flowchart illustrating an embodiment of performing an inferencing operation using the structure described with FIG. 16.

FIG. 17 is a flowchart illustrating an embodiment for performing an inferencing operation using the structure described with FIG. 16. Although the process described is for an inferencing operation, it can also be used as part of a training process, where the resulted are used as the input from step 1105 to perform the accuracy determination of step 1107 in FIG. 11A.

At step 1701 the binary weights are stored along the bit lines of pages in the memory 326. In many cases, these weights will have previously been stored before a user receives the memory device for use in inferencing based upon a previously performed training process. In other cases, a user may store the weights themselves. When used in a training process, the weights can be rewritten as the model is revised during the training process. When training, the updating of the weight matrices for the network can be as simple as issuing erase-program operations to the same page or writing to a separate page and updating the application to point to the new location of the neuron weights. Depending on the depth of the network, the array 326 can store weights from multiple networks, or only part of a network. In some embodiments, weights for multiple models of the same network can be stored in the array 326.

At step 1703, a page read command is issued, such as by the on-die control circuit 310 and state machine 312. Depending on the embodiment, the controller 102 can issue the individual read commands or just issue a general command to perform an inferencing operation using an initial input for a network. Based on the read command, a weight is read and loaded into the page buffer 1631.

As the storage capacity of memory devices, such as NAND flash memory, can be extremely large, in some embodiments a single device may store several models of a network simultaneously. For example, if the neural network is for a self-driving vehicle, different models could be used for different conditions, such as night versus day, dry roads versus wet roads. The weights for the different models could be stored within the same memory device and, as part of the flow, a model could be selected prior to step 1703 so that the appropriate pages/weight values are read out.

At step 1705, an input vector is received over the I/O interface 896 and loaded into the transfer buffer XDL 1633. This can be the initial input into the neural network or the input for the intermediate layer. In some cases, the input can be that of the output buffer as determined for a previous layer. Depending on the implementation, and this can vary from layer to layer, the reading of the page of weights at step 1703 and the loading of the input vector at step 1705 can be before, after, or overlapping. In one embodiment, the transfer of step 1705 is done while the read of step 1703 is being performed, so that step 1707 is waiting for the page read operation complete.

Once the set of weights and the input for the layer are respectively in the page buffer 1631 and XDL buffer 1633, the corresponding part of an inference operation can be performed at steps 1709-1715. At step 1709 the processor can perform a multiplication between the input and set of weights, such as in response to a command from the state machine 312 or autonomously by the one or more processing circuits 892 as part of a higher level inference command. In the embodiment of FIG. 16 and the mapping of binary weights described in FIG. 15, the multiplication is a comparison. The XNOR blocks 1634 of the one or more processing circuits 892 performs a bit-wise comparison to multiply of the contents of the page buffer 1631 with the transfer buffer XDL 1633 and stores the results in the result buffer 1635, which can be the same as the page buffer 1631 in some embodiments.

At step 1711 the processor can perform a summation (or bit scan) operation, such as in response to a command from the state machine 312 or autonomously. The summation block 1636 of the one or more processing circuits 892 counts the number of bits set in the result buffer 1635 and stores the results in the summation buffer 1637. If activation is performed within the latch structure, at step 1713 the result of the summation operation is read out of the summation buffer 1637 and the one or more processing circuits 892 applies an activation function to compute the output of the "neuron". The result of the activation can be stored into an activation buffer 1639 or, at step 1715, into the output buffer 1641. Although represented separately in FIG. 16 for expository purposes, the activation buffer 1639 can be part of the output buffer 1641. If a threshold comparison is used as the activation, the result can be used as the output of the "neuron" being computed. In some embodiments, if more complex activation functions are used, the summation results can be transferred out over the I/O interface 896 and the activation, or additional activation, can be performed outside of the latch structure, such as by the logic of the activation block 313. The output of multiple "neurons" can be used to construct the content of the output buffer 1641 of the layer in progress, with the result then output over the I/O interface 896 at step 1717 or loaded back into the transfer buffer XDL 1633 (if this differs from the output buffer 1641) for use as input for the next layer of the neural network without transfer out of the latch structure. In this way, results for multiple layers can be combined, stringing or concatenating the results, before they are transferred out.

Figure 18:
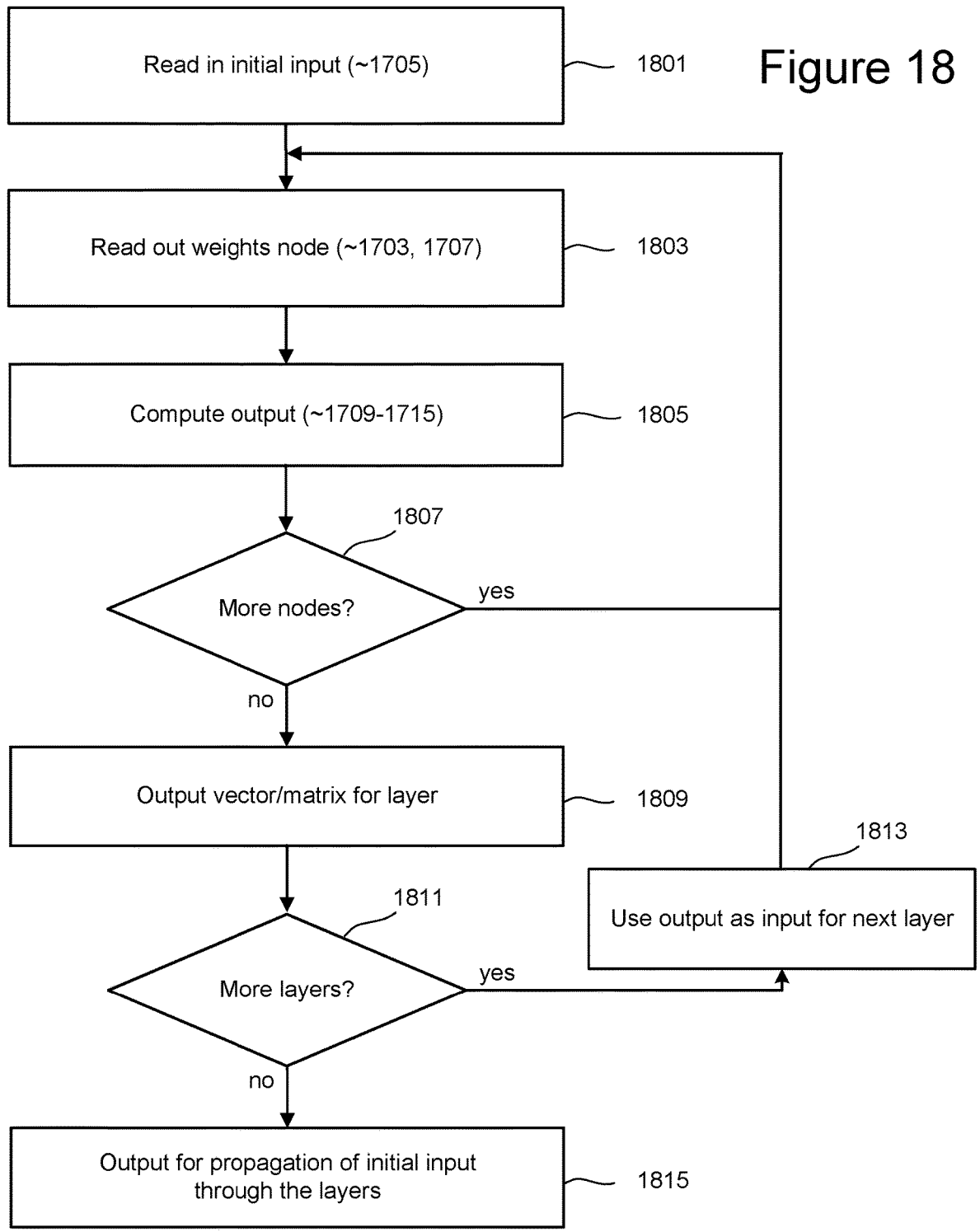
FIG. 18 illustrates one embodiment for applying a vector of input values for a layer of a neural network to the weights corresponding to the different nodes of the layer in order to generate a vector of output values for the layers, which can then serve as input for subsequent layer.

The flow of FIG. 17 describes the multiplication of an input vector with the set of weights for a single node. For example, referring to FIG. 12 or 13, this would refer to the set of inputs applied to the weight for one of the intermediate nodes, such as one of H1-H4 of FIG. 12 or $y_j$ for one value of j in FIG. 13. To perform an inference for all of the nodes of a layer, the input vector is applied to the weights corresponding to all of the nodes of a layer. To compute all of the outputs for a layer, the set of inputs is applied to all of the columns of weight matrix, corresponding the different j values of $y_j$ in FIG. 13. To compute the full output vector (the output data of FIG. 12) in an inference, the same input vector is applied to the different columns of the weight matrix for the layer to generate to an output vector. Once the full set of output for a layer is computed, it can then serve as the input to the next layer, where this process can be computed within the latch structure. FIG. 18 illustrates an embodiment for this process.

FIG. 18 illustrates one embodiment for applying a vector of input values for a layer of a neural network to the weights corresponding to the different nodes of the layer in order to generate a vector of output values for the layers, which can then serve as input for subsequent layer. This input can be the initial input for a neural network or the input to an intermediate layer. Beginning at step 1801, an input for a layer is read into the transfer buffer XDL 1633, which corresponds to step 1705 of the flow of FIG. 17. At step 1803, a set of weights for a first node is read out, corresponding to steps 1703 and 1707 of FIG. 17. In FIG. 17, step 1705 can occur before, after, or overlapping with steps 1703 and 1705. In FIG. 18, this will also be the case for the first set of weights, but for subsequent weights (that is, for later loops of FIG. 18), the input will have already be read in to the XDL buffer 1633. The computation of the node's output is determined and loaded into the output register 1641 at step 1805, where this can correspond to steps 1709-1715 of FIG. 17. Step 1807 determines if there are more weight columns and, if so, the flow loops back to step 1803 to read out the next set of weights. If there are not more nodes at step 1807, the flow goes to 1811 to determine whether there are more layers for which the output of the current layer can serve as input. If so, the results in output buffer 1641 is loaded back into the transfer buffer XDL 1633 at step 1813 to serve as input to the next layer at step 1803 at the subsequent loop. If there are no more layers to be computed with the weights of the current array, the output is provided for the output buffer 1641 through the I/O interface 896 at step 1815. The flow of FIG. 18 applies the same input to the weights of a number of different nodes for a single set of inputs supplied over the I/O interface 896 to the transfer buffer XDL 1633, but in alternate embodiments multiple different inputs can be received and applied sequentially to single set of weight values read into the page buffer 1631.

By performing the neural network computations within the latch structure of an array using weights stored on the array, performance, both in terms of speed and power consumption, can be significantly increased relative to implementations that need to transfer out the weights and perform the computation outside of the array and its structures. Pages of data will still be read into the page buffer, but this uses a high degree of parallelism that cannot be achieved when a read page of weight data has to be transferred output over the I/O interface 896. The logical computations of the XNOR-ing at elements 1634 and summing at elements 1636 can be executed quite quickly, as can be less complex activation functions in elements 1638. Consequently, this can allow multiple layers of large numbers of neurons to computed with high performance and low power consumption relative to previous approaches in which the weight data would need to be transferred out for multiply-accumulation (MAC) operations.

A number of generalizations and variations of the in-latch operations are possible. For example, in many memory technologies a page and, consequently, page buffer can be quite large. For example, in a NAND memory structure a page buffer can be 16 KB (=128 Kbits) wide. When the width of the page buffer 1631, which is typically determined by the number of bit lines in a block, is much larger than the width of the input vector, multiple neurons can be computed simultaneously. For example, if input vector are 1024 bits long and page buffers are 128 Kbits long, 128 neurons can be computed simultaneously. The summation of summation block 1636 and activation operations in the logic of activation block 1638 in the memory device can be configured to allow bit count in multiple segments of the data latch, such as by masking the segments not being computed. For example, a summation, or bit scan, command can count the number of bits set within a segment of the result buffer 1635 (which can be the same as the page buffer 1631 in some embodiments) or report counts of bits in multiple segments of the result/page buffer.

As the value of the summation result from the summation logic circuitry 1636 can be quite large given the size of some neural networks, in some embodiments a summation or bit scan command may only count a maximum number of bits before returning a result. When this is the case, in some embodiments the input vector can be limited to a length that avoids hitting the maximum count limitation. Another option is if the activation function is a simple threshold detector, then if the threshold can be less than the limit of the count or bit scan count, the activation can still use the result of the bit scan command since once the threshold is reached, counting can be discontinued and an activation result reported.

A number of techniques are also available to increase parallelism for the techniques and structures described above. For example, when a memory die includes multiple arrays, or planes, multiple neurons can be simultaneously computed by issuing independent commands to separate planes possible. More parallelism can be exploited by using multiple die memory packages in a memory package 104 (FIG. 4), as well as multiple packages within a memory system 100. The memory devices, whether by themselves or integrated into a larger storage device, can offer neural network capability in addition to the normal storage operations over the host interface, providing more of a computational storage operation.

Capabilities can be increased by incorporating a processor, such as a RISC-V CPU or CPU device 298 other along with some amount of RAM, into the memory package 104 of FIG. 4. The inclusion of a RISC-V CPU device 298 along with some RAM can be used to implement a complete neural network within the package. A custom CPU, such as a RISC-V CPU, can also be integrated on to the memory device in order to carry out much of the orchestration of commands and bit manipulations to implement a complete network within a single memory device. For example, in bonded die pair implementation as described with respect to FIG. 6, the additional area available on the CMOS or control circuitry die 608 can be used for the on-device CPU.

In a first set of embodiments, a non-volatile memory device includes an array of non-volatile memory cells configured to store at least a portion of one or more sets of weights of a neural network, read/write circuits connected to the array of non-volatile memory cells, and one or more processing circuits. The read/write circuits include: a read buffer configured to hold data read from the array; a plurality of sense amplifier circuits configured to read data storing a first set of weights for a first layer of the neural network from the array into the read buffer; an input/output interface configured to transfer data into and out of the read/write circuits; and a transfer buffer connected to the input/output interface and configured to store a first input for the first layer of the neural network received from the input/output interface. The one or more processing circuits are configured to: perform a first bit-wise arithmetical operation of the first set of weights of the first layer of the neural network stored in the read buffer with the first input for the first layer of the neural network stored in the transfer buffer, sum a result of the first bit-wise arithmetical operation, perform an activation on the sum of the result of the first bit-wise arithmetical operation, and transfer out over the input/output interface a result of the activation on the sum of the result of the first bit-wise arithmetical operation.

In additional embodiments, a method includes reading out data holding a first set of weights for a first layer of a neural network from a non-volatile memory array into a first buffer of a latch structure of the non-volatile memory array and storing a first input for the first layer of the neural network in a second buffer of the latch structure. The method also includes performing an inferencing operation for the neural network within the latch structure. The inferencing operation includes: performing a first bit-wise arithmetical operation between the first set of weights for the first layer of a neural network and the first input for the first layer of the neural network; summing a result of the first bit-wise arithmetical operation; and performing an activation operation on the summing of the result of the first bit-wise arithmetical operation. The result of the inferencing operation is transferred out of the latch structure.

Further embodiments include a non-volatile memory device having an array of non-volatile memory cells configured to store a plurality of weights of a neural network; a plurality of buffers connected to the array and configured to store data read from the array; and means for performing an inferencing operation for the neural network within the plurality of buffers by performing a first multiply and accumulation operation between weights of a first layer of the neural network read from the array into the plurality of buffers and an input for the first layer of the neural network as transferred into the plurality of buffers.

An example embodiment for the data buffers is the structure illustrated in FIG. 16, that can include some or all of page (or, more generally, read) buffer 1631, XDL buffer 1633, XNOR result buffer 1635, summation result buffer 1637, activation result buffer 1639, and output buffer 1641. The buffers can be part of the latch structure within the read/write circuits 328, such as the data latches 894 described above with respect to FIG. 8.

An example embodiment of the means for performing an inferencing operation for the neural network within the plurality of buffers includes the structures depicted in FIG. 16 performing the operations of FIGS. 17 and 18. More specifically, this can include XNOR elements 1634, summation block 1636, and activation 1638. As described in more detail above, these elements can be implemented by logic of the one or more processing circuits 892 of FIG. 8, state machine 312, and other control circuits on the die 300 of FIG. 5 or of peripheral or control circuitry die 608.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
an array of non-volatile memory cells configured to store at least a portion of one or more sets of weights of a neural network;
read/write circuits connected to the array of non-volatile memory cells, the read/write circuits comprising:
a read buffer configured to hold data read from the array;
a plurality of sense amplifier circuits configured to read data storing a first set of weights for a first layer of the neural network from the array into the read buffer;
an input/output interface configured to transfer data into and out of the read/write circuits; and
a transfer buffer connected to the input/output interface and configured to store a first input for the first layer of the neural network received from the input/output interface; and
one or more processing circuits configured to:
perform a first bit-wise arithmetical operation of the first set of weights of the first layer of the neural network stored in the read buffer with the first input for the first layer of the neural network stored in the transfer buffer, sum a result of the first bit-wise arithmetical operation,
perform an activation on the sum of the result of the first bit-wise arithmetical operation, and
transfer out over the input/output interface a result of the activation on the sum of the result of the first bit-wise arithmetical operation.

2. The non-volatile memory device of claim 1, wherein, to perform the activation, the one or more processing circuits are configured to:
determine whether the sum exceeds a threshold value.

3. The non-volatile memory device of claim 1, wherein the read/write circuits further comprising:
an output buffer configured to store the result of the activation on the sum of the result of the first bit-wise arithmetical operation prior to being transferred out over the input/output interface.

4. The non-volatile memory device of claim 1, wherein:
the plurality of sense amplifier circuits are further configured to read data storing a second set of weights for a first layer of the neural network from the array in the read buffer, and
the one or more processing circuits are further configured to:
perform a second bit-wise arithmetical operation the second set of weights of the first layer of the neural network stored in the read buffer with the first input for the first layer of the neural network stored in the transfer buffer;
sum a result of the second bit-wise arithmetical operation; and
perform an activation on the sum of the result of the second bit-wise arithmetical operation.

5. The non-volatile memory device of claim 4, wherein the one or more processing circuits are further configured to:
combine a result of the activation on the sum of the result of the first bit-wise arithmetical operation and the activation on the sum of the result of the second bit-wise arithmetical operation prior to transferring out the result of the activation of the result of the first bit-wise arithmetical operation.

6. The non-volatile memory device of claim 5, wherein:
the plurality of sense amplifier circuits are further configured to read data storing a set of weights for a second layer of the neural network from the array in the read buffer, and
the one or more processing circuits are further configured to:
store, in the transfer buffer, the accumulated result of the activation, and
perform a bit-wise arithmetical operation the set of weights of the second layer of the neural network stored in the read buffer with the accumulated result of the activation stored in the transfer buffer.

7. The non-volatile memory device of claim 1, wherein:
the transfer buffer is further configured to store a second input for the first layer of the neural network received from the input/output interface; and
the one or more processing circuits are further configured to, prior to transferring out the result of the first bit-wise arithmetical operation, perform a bit-wise arithmetical operation the first set of weights of the first layer of the neural network stored in the read buffer with the second input for the first layer of the neural network stored in the transfer buffer.

8. The non-volatile memory device of claim 1, further comprising:
one or more control circuits configured to perform additional activation on the result of the activation on the sum of the result of the first bit-wise arithmetical operation transferred out over the input/output interface.

9. The non-volatile memory device of claim 1, wherein:
the array of non-volatile memory cells and the read/write circuits are formed as part of a single die.

10. The non-volatile memory device of claim 1, wherein:
the array of non-volatile memory cells is formed as part of a first die and the read/write circuits are formed as part of a second memory die, the first die and second die forming a bonded die pair.

11. The non-volatile memory device of claim 1, wherein the weights of the neural network are binary valued and the first input of the first layer of the neural network is binary valued.

12. The non-volatile memory device of claim 11, wherein one or more processing circuits configured to:
perform the first bit-wise arithmetical operation the first set of weights of the first layer of the neural network with the first input for the first layer of the neural network by performing an exclusive not OR (XNOR) operation of contents of the read buffer with contents of the transfer buffer.

13. The non-volatile memory device of claim 1, wherein the array of non-volatile memory cells is configured to store weights of a plurality of models of the neural network, the non-volatile memory device further comprising:
one or more control circuits configured to selecting a model for the neural network, the first set of weights for the first layer of the neural network corresponds to the selected model.

14. A method, comprising:
reading out data holding a first set of weights for a first layer of a neural network from a non-volatile memory array into a first buffer of a latch structure of the non-volatile memory array;
storing a first input for the first layer of the neural network in a second buffer of the latch structure; and
performing an inferencing operation for the neural network within the latch structure, comprising:
performing a first bit-wise arithmetical operation between the first set of weights for the first layer of a neural network and the first input for the first layer of the neural network;
summing a result of the first bit-wise arithmetical operation; and
performing an activation operation on the summing of the result of the first bit-wise arithmetical operation; and
transferring a result of the inferencing operation out of the latch structure.

15. The method of claim 14, further comprising:
subsequent to performing the first bit-wise arithmetical operation, reading out data holding a second set of weights for a first layer of the neural network from the non-volatile memory array into the first buffer of the latch structure;
wherein performing the inferencing operation for the neural network within the latch structure further comprises:
performing a second bit-wise arithmetical operation between the second set of weights for the first layer of a neural network and the first input for the first layer of the neural network;

summing a result of the second bit-wise arithmetical operation; and performing an activation operation on the summing of the result of the second bit-wise arithmetical operation.

16. The method of claim 15, wherein performing the inferencing operation for the neural network within the latch structure further comprises:

accumulating results of the activation operation on the summing of the result of the first bit-wise arithmetical operation and the activation operation on the summing of the result of the second bit-wise arithmetical operation.

17. The method of claim 16, further comprising:

subsequent to performing the second bit-wise arithmetical operation, reading out \ data holding a set of weights for a second layer of a neural network from a non-volatile memory array into the first buffer; and storing the accumulated results of the activation operation of the summing of the result of the first bit-wise arithmetical operation and the activation operation on the summing of the result of the second bit-wise arithmetical operation in the second buffer, wherein performing the inferencing operation for the neural network within the latch structure further comprises:

performing a third bit-wise arithmetical operation between the set of weights for the second layer of a neural network and the accumulated results of the activation operation of the summing of the result of the first bit-wise arithmetical operation and the activation operation on the summing of the result of the second bit-wise arithmetical operation; and summing a result of the third bit-wise arithmetical operation.

18. The method of claim 14, wherein the non-volatile memory array stores weights for the first layer for the neural network corresponding to a plurality of different models for the neural network, the method further comprising:

selecting a model for the neural network, wherein the first set of weights for the first layer of the neural network corresponds to the selected model.

19. A non-volatile memory device, comprising:

an array of non-volatile memory cells configured to store a plurality of weights of a neural network;

a plurality of buffers connected to the array and configured to store data read from the array; and means for performing an inferencing operation for the neural network within the plurality of buffers by performing a first multiply and accumulation operation between weights of a first layer of the neural network read from the array into the plurality of buffers and an input for the first layer of the neural network as transferred into the plurality of buffers.

20. The non-volatile memory device of claim 19, wherein the means for performing an inferencing operation for the neural network within the plurality of buffers further performs the inferencing operation by using a result of the first multiply and accumulation operation as an input for a second multiply and accumulation operation with weights of a second layer of the neural network read from the array into the plurality of buffers.

* * * * *